US012757795B2

(12) United States Patent
Chiu et al.

(10) Patent No.: US 12,757,795 B2
(45) Date of Patent: Oct. 6, 2026

(54) SEMICONDUCTOR PACKAGE AND METHOD FOR MANUFACTURING A SEMICONDUCTOR PACKAGE

(71) Applicant: SERIPHY TECHNOLOGY CORPORATION, Hsinchu County (TW)

(72) Inventors: Tzu-Wei Chiu, Hsinchu County (TW); Chun-Wei Chang, Taipei City (TW); Wei-Chih Chen, Taoyuan City (TW); Che-Yen Huang, Hsinchu County (TW)

(73) Assignee: SERIPHY TECHNOLOGY CORPORATION, Hsinchu County (TW)

( * ) Notice: Subject to any disclaimer, the term of this patent is extended or adjusted under 35 U.S.C. 154(b) by 414 days.

(21) Appl. No.: 18/537,351

(22) Filed: Dec. 12, 2023

(65) Prior Publication Data

US 2024/0203941 A1 Jun. 20, 2024

Related U.S. Application Data

(60) Provisional application No. 63/580,587, filed on Sep. 5, 2023, provisional application No. 63/387,568, filed on Dec. 15, 2022.

(51) Int. Cl.
*H10W 90/00* (2026.01)
*H10W 20/20* (2026.01)
(Continued)

(52) U.S. Cl.
CPC ........... *H10W 90/00* (2026.01); *H10W 20/20* (2026.01); *H10W 70/65* (2026.01);
(Continued)

(58) Field of Classification Search
None
See application file for complete search history.

(56) References Cited

U.S. PATENT DOCUMENTS 9,607,967 B1 * 3/2017 Shih ........................ H10P 72/74
2015/0303174 A1 * 10/2015 Yu ........................... H10P 72/74 438/109

(Continued)

OTHER PUBLICATIONS

Wang, C. T., Chang, W. L., Chen, C. Y., Yu, D. (2020). Immersion in memory compute (IMMC) technology. 2020 IEEE Symposium on VLSI Technology. https://doi.org/10.1109/vlsitechnology18217.2020.9265019.

(Continued)

*Primary Examiner* — Michelle Mandala
(74) *Attorney, Agent, or Firm* — WPAT, P.C.; Anthony King

(57) ABSTRACT

The present application discloses a semiconductor package and a method for manufacturing the semiconductor package. The semiconductor package includes a first dielectric layer, a first redistribution layer (RDL) disposed on a first surface of the first dielectric layer, a first bonding layer disposed on the first RDL, a plurality of bottom dies attached to the first bonding layer, a second dielectric layer filling gaps between the bottom dies, a plurality of conductive pillars disposed in the second dielectric layer without contacting the bottom dies, a second RDL disposed on the second dielectric layer and the bottom dies, a second bonding layer disposed on the second RDL, a plurality of top dies attached to the second bonding layer, a third dielectric layer filling gaps between the top dies, and a plurality of solder bumps disposed on a second surface of the first dielectric layer.

20 Claims, 27 Drawing Sheets

(51) Int. Cl.
*H10W 70/65* (2026.01)
*H10W 70/685* (2026.01)
*H10W 74/00* (2026.01)

(52) U.S. Cl.
CPC ....... *H10W 70/685* (2026.01); *H10W 90/701* (2026.01); *H10W 74/00* (2026.01); *H10W 90/734* (2026.01)

(56) References Cited

U.S. PATENT DOCUMENTS

| | | | | |
|---|---|---|---|---|
| 2017/0040266 | A1 | 2/2017 | Lin | |
| 2017/0365587 | A1* | 12/2017 | Hung | H10W 70/05 |
| 2019/0103386 | A1 | 4/2019 | Chen | |
| 2019/0157228 | A1 | 5/2019 | Yu | |
| 2021/0305086 | A1* | 9/2021 | Yu | H10W 20/01 |
| 2023/0187363 | A1* | 6/2023 | Lin | H10W 70/05<br>257/668 |
| 2024/0120282 | A1 | 4/2024 | Chiu | |
| 2024/0203848 | A1 | 6/2024 | Chiu | |
| 2024/0203941 | A1 | 6/2024 | Chiu | |

OTHER PUBLICATIONS

Office Action dated Nov. 19, 2025, related to the US family patent application of the subject U.S. Patent Application.
Office Action dated May 26, 2026, related to the US family patent application.

* cited by examiner

SEMICONDUCTOR PACKAGE AND METHOD FOR MANUFACTURING A SEMICONDUCTOR PACKAGE

CROSS REFERENCE

This application claims the benefit of prior-filed U.S. provisional applications No. 63/387,568, filed on Dec. 15, 2022, and No. 63/580,587, filed on Sep. 5, 2023, which are incorporated by reference in its entirety.

TECHNICAL FIELD

The present disclosure relates to a semiconductor package, and more particularly, to a semiconductor structure having a die-stacking structure.

DISCUSSION OF THE BACKGROUND

As the artificial intellectual (AI) models have been applied to more and more fields, a demand for suitable hardware having greater computation capability also raises. Since the AI models usually require large amounts of parallel computing, most of the computation hardware includes multiple cores, which requires large circuit area. Therefore, researches have been conducted to embed more computation power within a smaller area. However, as the computing power per unit area gradually increases, heat dissipation also becomes a major challenge in packaging design. In addition, as the computing power continues to improve, the bottleneck of system performance may gradually shift towards the memory bandwidth or the data sharing speed between different cores, which make the packaging design even more complicated. Therefore, providing a semiconductor structure that can facilitate greater computation capability within a smaller area has become an issue to be solved.

SUMMARY

One aspect of the present disclosure provides a semiconductor package. The semiconductor package includes a first dielectric layer, a first redistribution layer (RDL), a first bonding layer, a plurality of bottom dies, a second dielectric layer, a plurality of conductive pillars, a second bonding layer, a plurality of top dies, a third dielectric layer, and a plurality of solder bumps. The first RDL is disposed on a first surface of the first dielectric layer. The first bonding layer is disposed on the first RDL. The plurality of bottom dies have bonding layers attached to the first bonding layer. The second dielectric layer fills gaps between the bottom dies. The plurality of conductive pillars are disposed in the second dielectric layer without contacting the bottom dies. The second RDL is disposed on the second dielectric layer and is coupled the conductive pillars and a plurality of through silicon vias (TSVs) formed in backsides of the bottom dies. The second bonding layer is disposed on the second RDL. The plurality of top dies have bonding layers attached to the second bonding layer. The third dielectric layer fills gaps between the top dies. The plurality of solder bumps are disposed on a second surface of the first dielectric layer and are coupled to the first RDL through openings of the first dielectric layer.

Another aspect of the present disclosure provides a method for manufacturing a semiconductor package. The method includes receiving a first silicon wafer, forming a first dielectric layer on the first silicon wafer, forming a first RDL on a first surface of the first dielectric layer, forming a first bonding layer on the first RDL, attaching a plurality of bottom dies to the first bonding layer by hybrid bonding, forming a second dielectric layer on the bottom dies, wherein the second dielectric layer fills gaps between the bottom dies, grinding the second dielectric layer and the backsides of the bottom dies so as to reveal a plurality of through silicon vias (TSVs) formed in the backsides of the bottom dies, forming a plurality of conductive pillars in the second dielectric layer without contacting the bottom dies, forming a second RDL on the second dielectric layer, the bottom dies, and the conductive pillars, forming a second bonding layer on the second RDL, attaching a plurality of top dies to the second bonding layer by hybrid bonding, forming a third dielectric layer on the top dies, wherein the third dielectric layer fills gaps between the top dies, grinding the third dielectric layer and backsides of the top dies, attaching a second silicon wafer to the third dielectric layer and the backsides of the top dies, removing the first silicon wafer, and forming a plurality of solder bumps on a second surface of the first dielectric layer.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

The following description accompanies drawings, which are incorporated in and constitute a part of this specification, and which illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1:
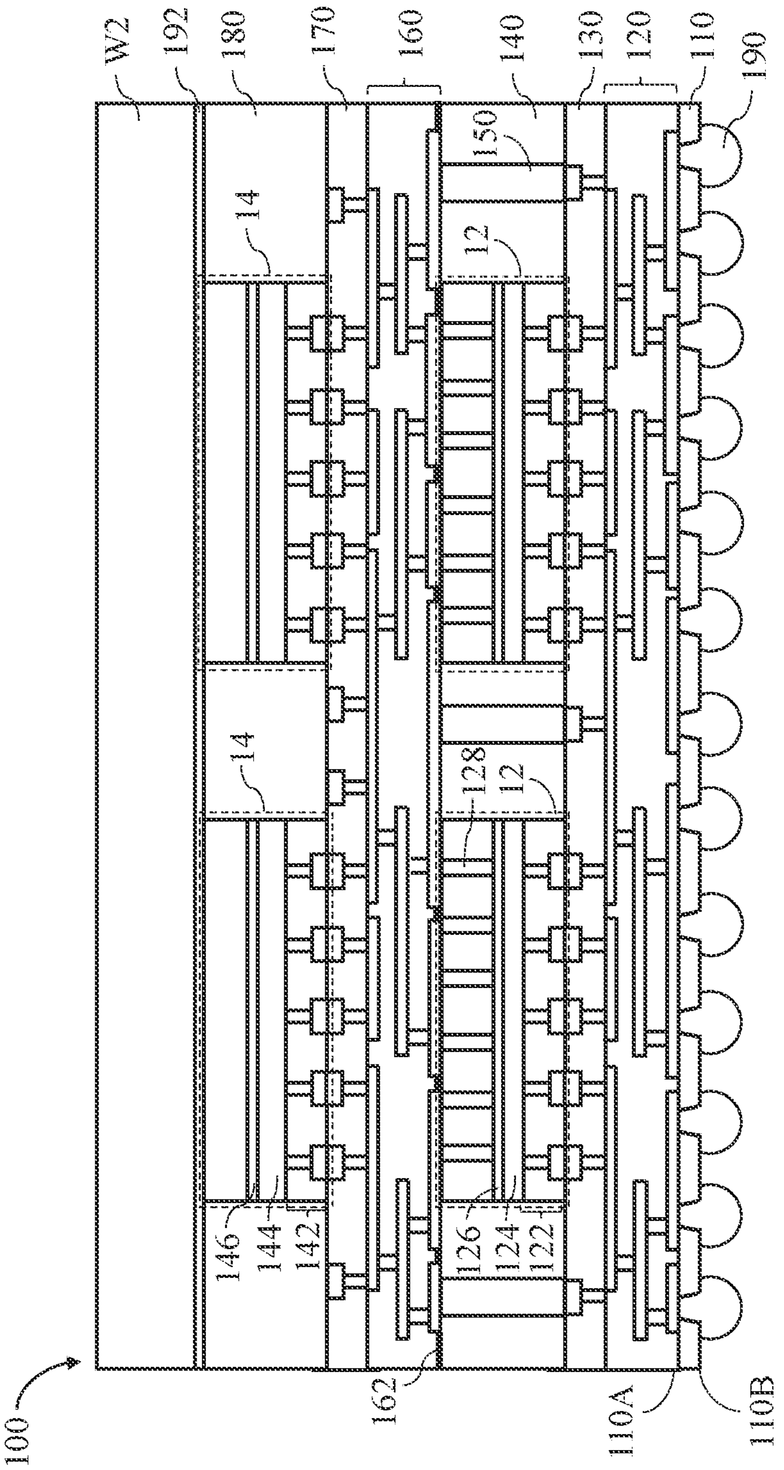
FIG. 1 shows a semiconductor structure according to one embodiment of the present disclosure.

FIG. 1 shows a semiconductor structure 100 according to one embodiment of the present disclosure. The semiconductor structure 100 includes a first dielectric layer 110, a redistribution layer (RDL) 120, a first bonding layer 130, a plurality of bottom dies 12, a second dielectric layer 140, a plurality of conductive pillars 150, a second RDL 160, a second bonding layer 170, a plurality of top dies 14, a third dielectric layer 180, and a plurality of solder bumps 190.

The first RDL 120 is disposed on a first surface 110A of the first dielectric layer 110. The first bonding layer 130 is disposed on the first RDL 120. Each of the bottom dies 12 has a bonding layer 122, an interconnect layer 124 (including multiple levels of metal lines formed in the back end of line), a device layer 126 (including transistors formed in the front end of line), and a plurality of through silicon vias (TSVs) 128. Generally, a front side of a die is referred to the side with the device layer and the interconnect layer, and a backside of a die is referred to the side with the substrate. In the present embodiment, the bottom dies 12 are attached to the first bonding layer 120 by its bonding layer 122, that is, the bottom dies 12 are disposed on the bonding layer 130 with its backside up. The second dielectric layer 140 fills the gaps between the bottom dies 12. The conductive pillars 150 are disposed in the second dielectric layer 140 without contacting the bottom dies 12.

The second RDL 160 is disposed on the second dielectric layer 140 and coupled to the conductive pillars 150 and TSVs 128 formed in the backsides of the bottom dies 12. The second bonding layer 170 is disposed on the second RDL 160. Each of the top dies 14 has a bonding layer 142, an interconnect layer 144 (including multiple levels of metal lines formed in the back end of line), and a device layer 146 (including transistors formed in the front end of line). The top dies 14 are attached to the second bonding layer 170 by its bonding layer 142. That is, the top dies 14 are disposed on the second RDL 160 and the bonding layer 170 with its backside up. The third dielectric layer 180 fills the gaps between the top dies 14. The solder bumps 190 are disposed on a second surface 110B of the first dielectric layer 110 and coupled to the first RDL 120 through openings of the first dielectric layer 110.

In the present embodiment, the first RDL 120 and the second RDL 160 can provide connecting paths among the bottom dies 12 and the top dies 14 so that each bottom die 12 can be coupled to at least another bottom die 12 and at least one top die 14, and each top die 14 can be coupled to at least another top die 14 and at least one bottom die 12. Furthermore, the top dies 14 and the bottom dies 12 may have front side power delivery network (FSPDN) to receive power form their front sides. For example, the top dies 14 can receive power through the solder bumps 190, the first RDL 120, the conductive pillars 150, and the second RDL 160, and the bottom dies 12 can receive power through the solder bumps 190 and the first RDL 120. However, the present disclosure is not limited thereto. In some embodiments, the bottom dies 12 may have back side power delivery network (BSPDN) to receive power from the solder bumps 190 through the first RDL 120, the conductive pillars 150, the second RDL 160, and the TSVs 128.

In addition, in the present embodiment, the bottom dies 12 and the top dies 14 can be attached on and coupled to the first RDL 120 and the second RDL 160 respectively through the hybrid bonding structures. Since the hybrid bonding technique can provide low resistant connections between the dies and the RDL, resistance of the connecting paths among the bottom dies 12 and the top dies 14 can be significantly reduced. In addition, since no underfill is required for hybrid bonding, the heat generated by the dies 12 and 14 can be dissipated more easily, thereby alleviating the concerns of the thermal issue.

Figure 2A:
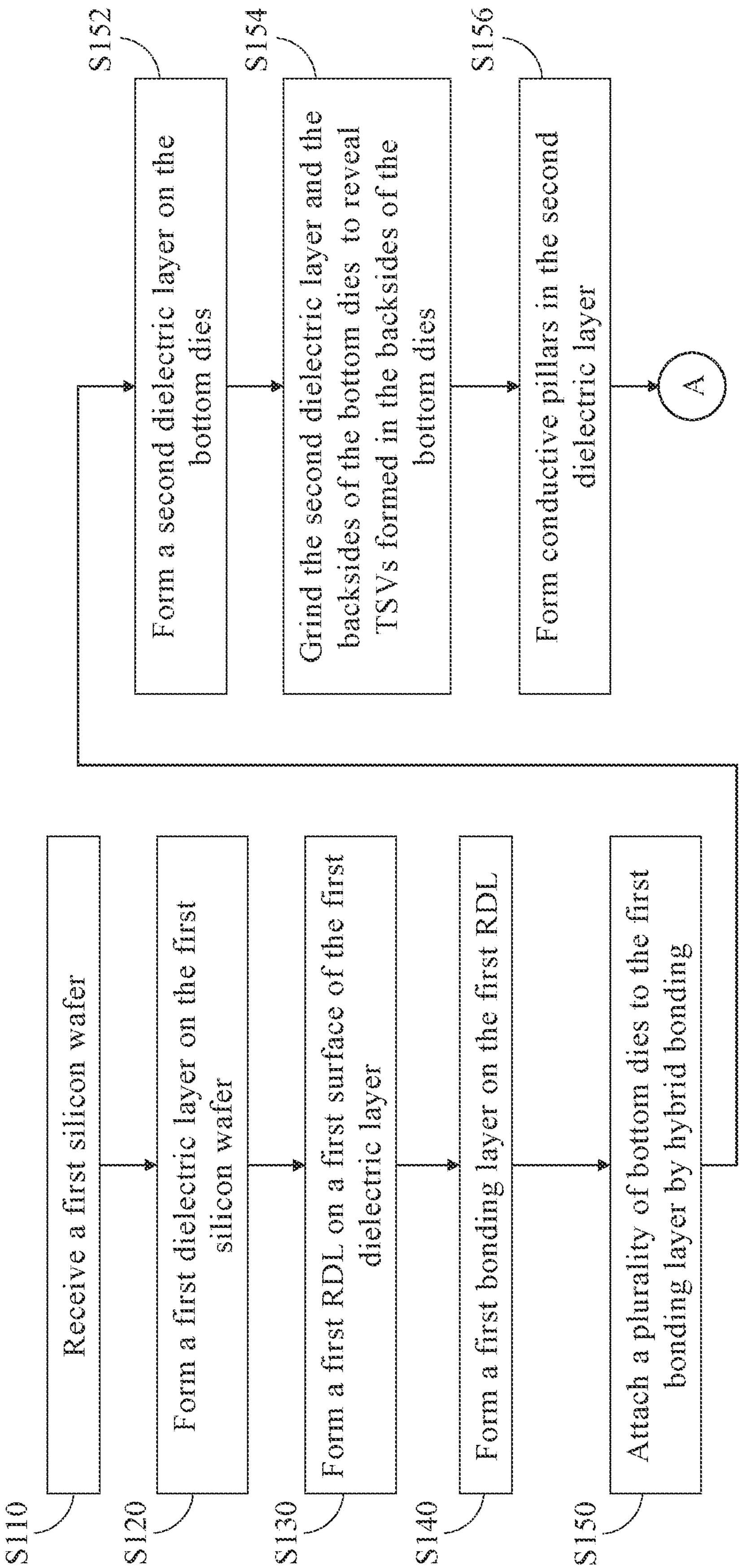
FIGS. 2A and 2B show a flow chart of a method for manufacturing the semiconductor structure according to one embodiment of the present disclosure.
Figure 2B:
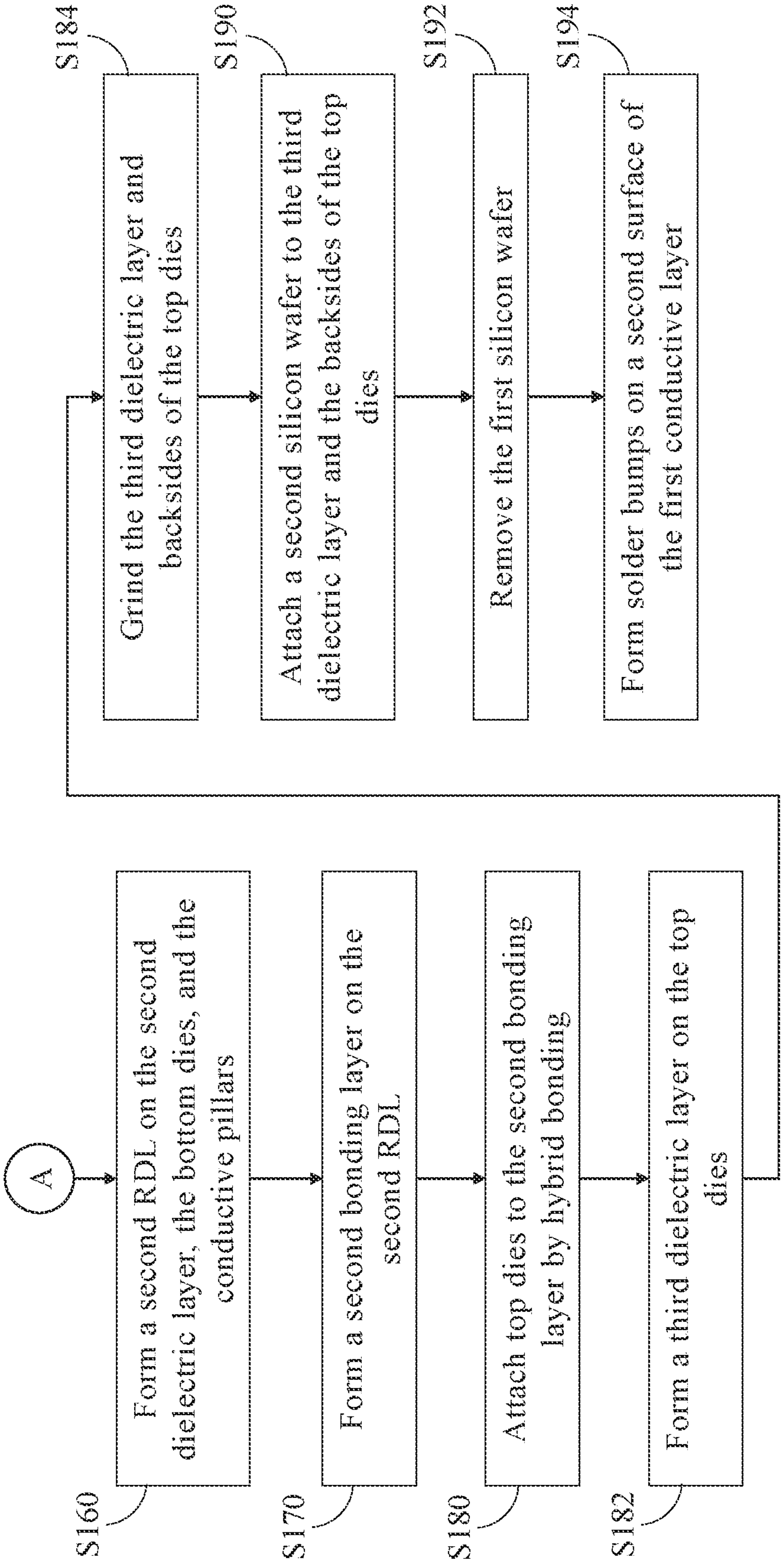
Figure 3A:
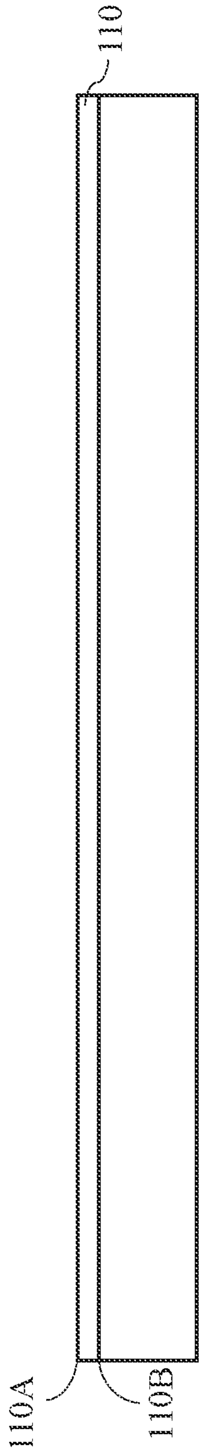
FIGS. 3A to 3O show the forming process of the semiconductor structure according to the method in FIGS. 2A and 2B.

FIGS. 2A and 2B show a flow chart of a method M1 for manufacturing the semiconductor structure 100 according to one embodiment of the present disclosure. The method M1 includes steps S110 to S194. FIGS. 3A to 3O show the forming process of the semiconductor structure 100 according to the method M1.

In step S110, a first silicon wafer W1 is received. In some embodiments, the first silicon wafer W1 can be a 300 mm wafer. Afterwards, the first dielectric layer 110 can be formed on the first silicon wafer W1 in step S120 as shown FIG. 3A. The first dielectric layer 110 has a first surface 110A and a second surface 110B opposite to the first surface 110A. In the present embodiment, the second surface 110B is closer to the first silicon wafer W1 while the first surface 110A is farer away from the first silicon wafer W1. In some embodiments, the first silicon wafer W1 is removable from the first dielectric layer 100, and the first dielectric layer 110 can be the passivation layer for forming the solder bumps in the subsequent steps.

Figure 3B:
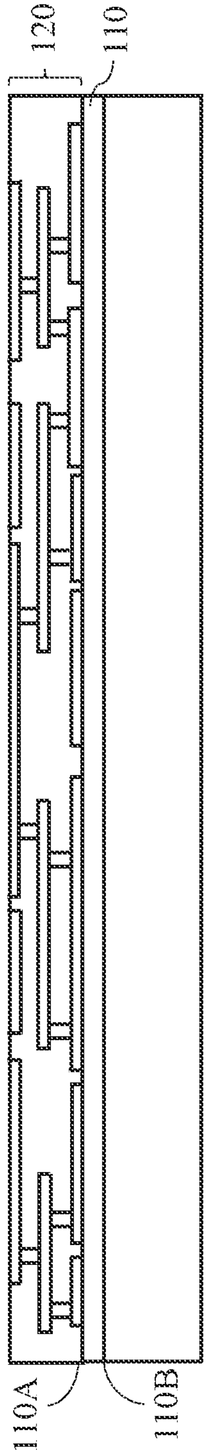

In step S130, the first RDL 120 is formed on the first surface 110A of the first dielectric layer 110 as shown in FIG. 3B. The first RDL 120 may include metal lines at different levels, vias that connect metal lines from one level to another, and dielectric layers that separate the different metal lines.

Figure 3C:
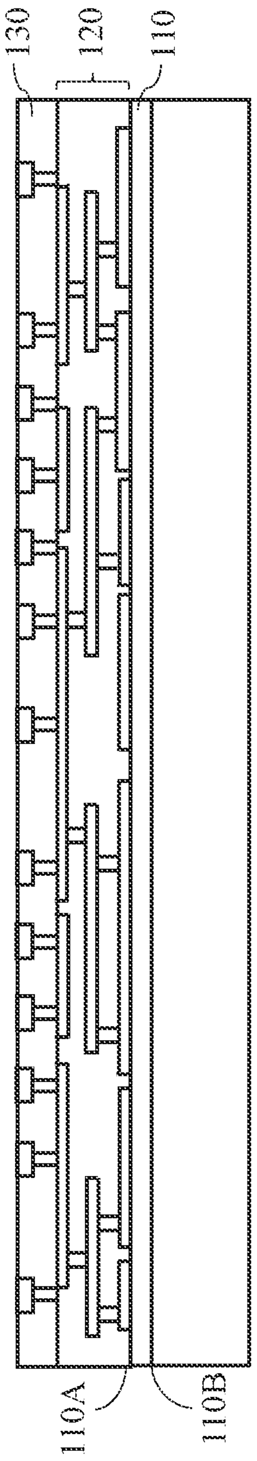
Figure 3D:
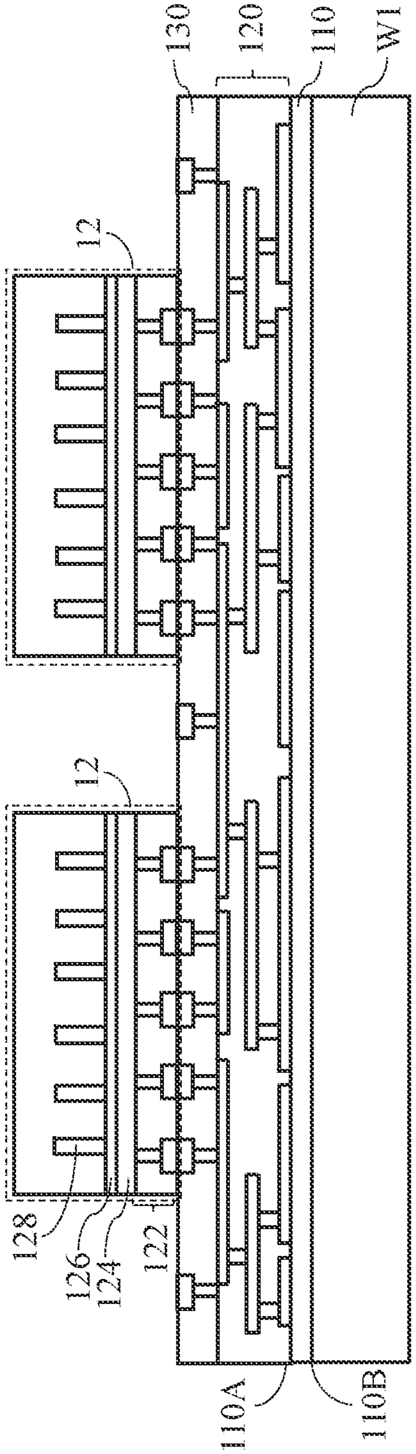

In step S140, the first bonding layer 130 is formed on the first RDL 120 as shown in FIG. 3C, and thus, in step S150, the bottom dies 12 can be attached to the first bonding layer 130 by hybrid bonding as shown in FIG. 3D. In the present embodiments, the first bonding layer 130 may include metal pads, such as copper pads, formed within a dielectric layer, such as silicon oxide. Also, the bonding layer 122 of the bottom dies 120 may include bonding structures, such as copper pad, formed within the dielectric layer. In the present embodiment, the bottom dies 12 are attached to the first bonding layer 130 in a face-down manner, that is, the front sides of the bottom dies 12 are located in close proximity to the first bonding layer 130 and the backsides of the bottom dies 12 are farther away from the first bonding layer 130 compared to the front side.

During the bonding process between the first bonding layer 130 and the bottom dies 12, the initial bond occurs at the dielectric-to-dielectric interface at room temperature under atmospheric conditions. Subsequently, the copper metal-to-metal connection is formed via annealing and metal diffusion. The hybrid bonding allows smaller pitch than the conventional micro bump bonding. For example, the pitch of the micro bumps may be 10 μm to 20 μm while the pitch of the hybrid bonding may be under 10 μm, such as 9 μm. Furthermore, the hybrid bonding can provide interconnections between the wafer and the dies with lower resistance, so that the efficiency of the signal transmission can be improved.

Figure 3E:
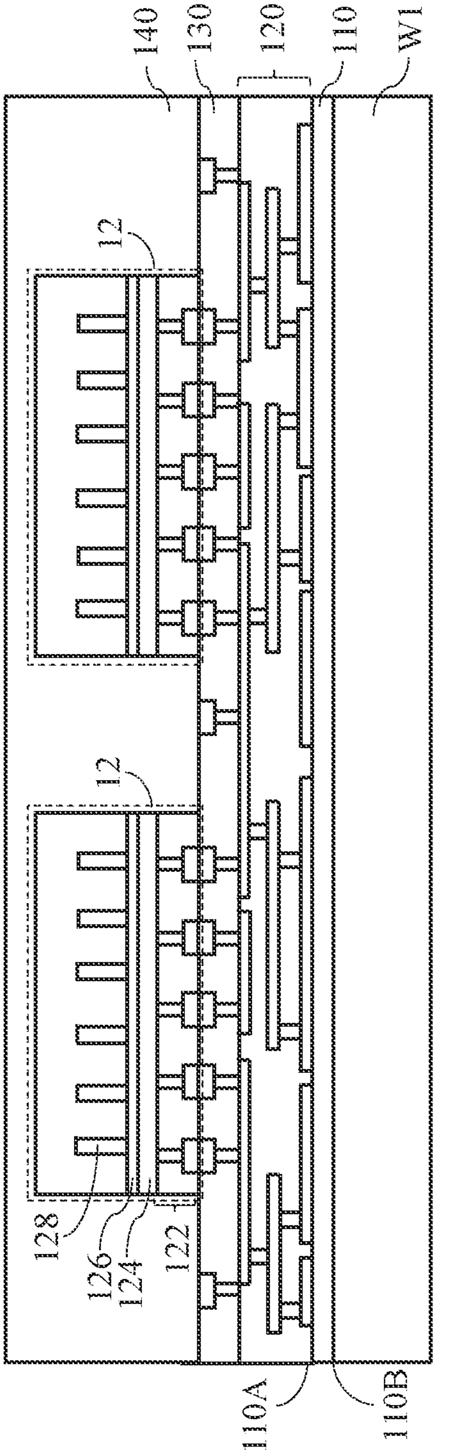
Figure 3F:
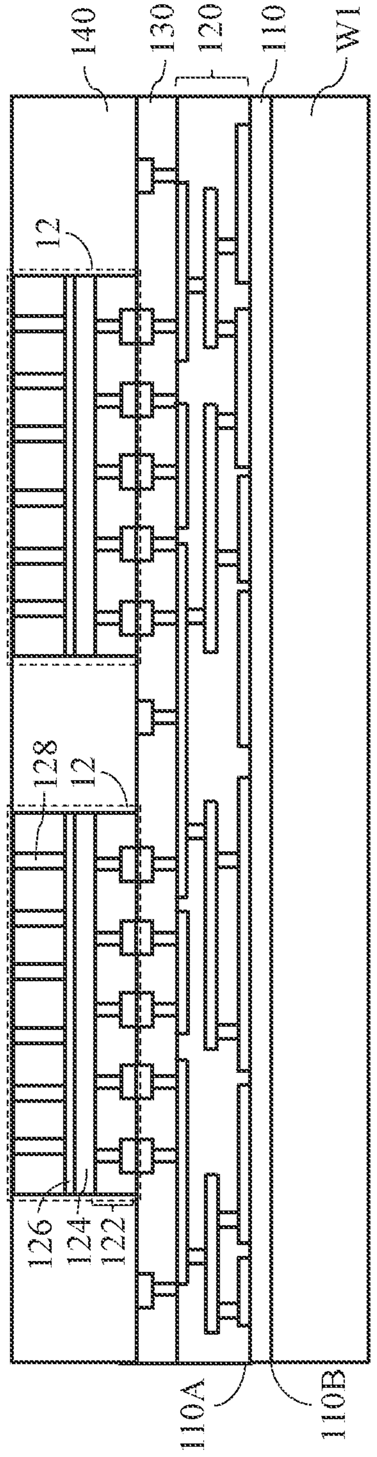

In step S152, the second dielectric layer 140 can be formed on the bottom dies 12, and the second dielectric layer 140 can fill the gaps between the bottom dies 12 as shown in FIG. 3E. In some embodiments, to facilitate the formation of the second dielectric layer 140, the backsides of the bottom dies 12 may be grinded to be thinner before the second dielectric layer 140 is formed. Then, after the second dielectric layer 140 is formed, the second dielectric layer 140 and the backsides of the bottom dies 12 can be grinded in step S154 so that the TSVs 128 formed in the backsides of the bottom dies 12 can be exposed as shown in FIG. 3F.

Figure 3G:
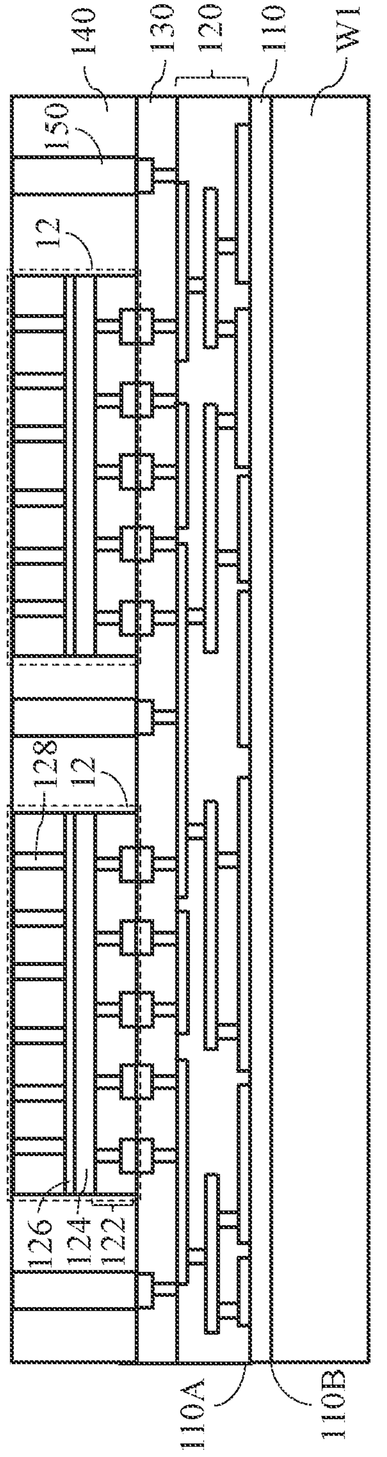

In step S156, the conductive pillars 150 can be formed in the second dielectric layer 140 as shown in FIG. 3G. In some embodiments, the conductive pillars 150 can include copper, and step S156 may include sub-steps for forming openings in the second dielectric layer 140, sputtering a seed layer (not shown) over the second dielectric layer 140 and the backsides of the bottom dies 12, platting a copper layer on the seed layer to fill the openings in the second dielectric layer 140, and grinding the copper layer to remove the unwanted part of copper left on the second dielectric layer 140. As a result, the conductive pillars 150, that is, the copper pillars, can be formed.

Figure 3H:
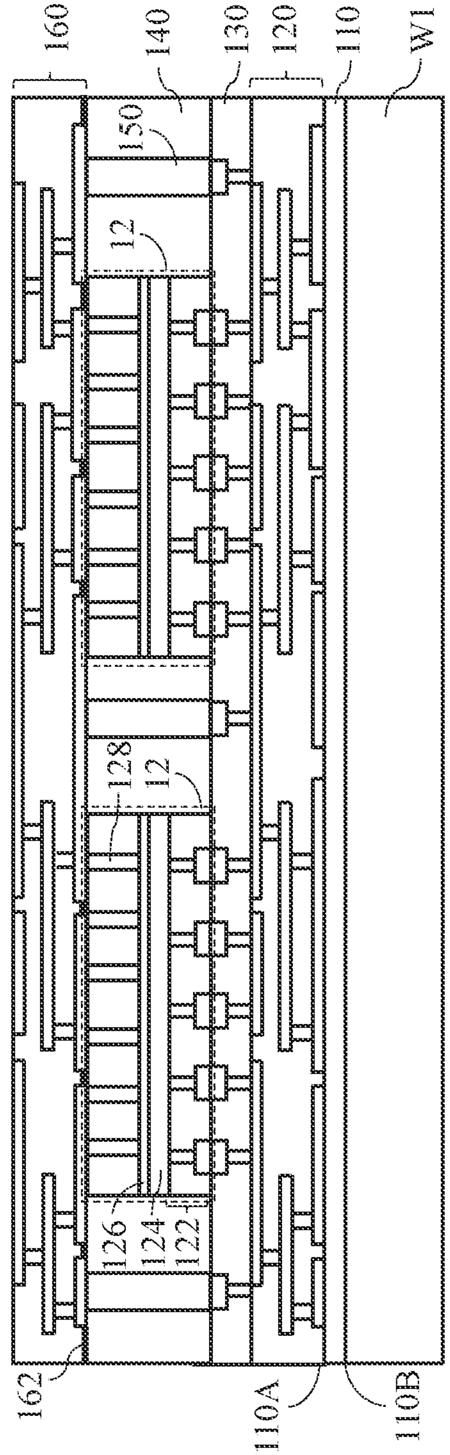

In step S160, the second RDL 160 is formed on the second dielectric layer 140, the bottom dies 12, and the conductive pillars 150 as shown in FIG. 3H. In the present embodiments, to avoid the metal lines in the second RDL 160 from being short-circuited unexpectedly, an isolation layer 162 can be formed on the second dielectric layer 140 before the second RDL 160 is formed. The isolation layer 162 can be patterned to expose the TSVs 128 and the conductive pillars 150 so that the second RDL 160 can be coupled to the TSVs 128 and the conductive pillars 150 through the openings of the isolation layer 162. The isolation layer 162 may include silicon oxide, silicon nitride or other suitable materials, and may be formed by chemical vapor deposition (CVD).

Figure 3I:
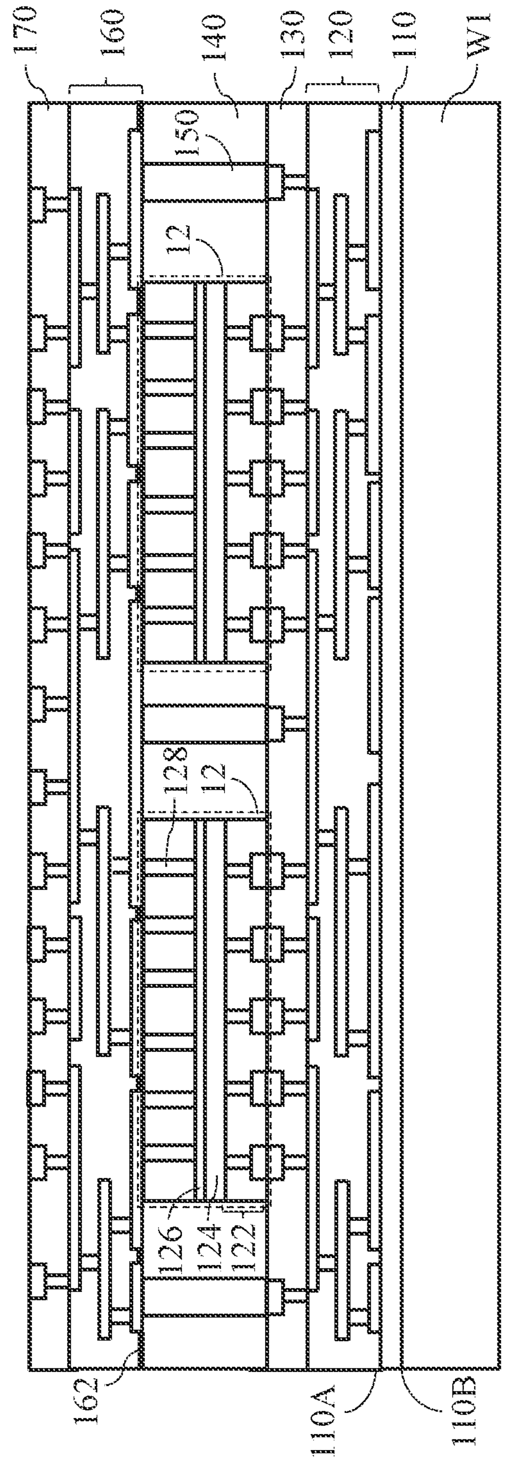
Figure 3J:
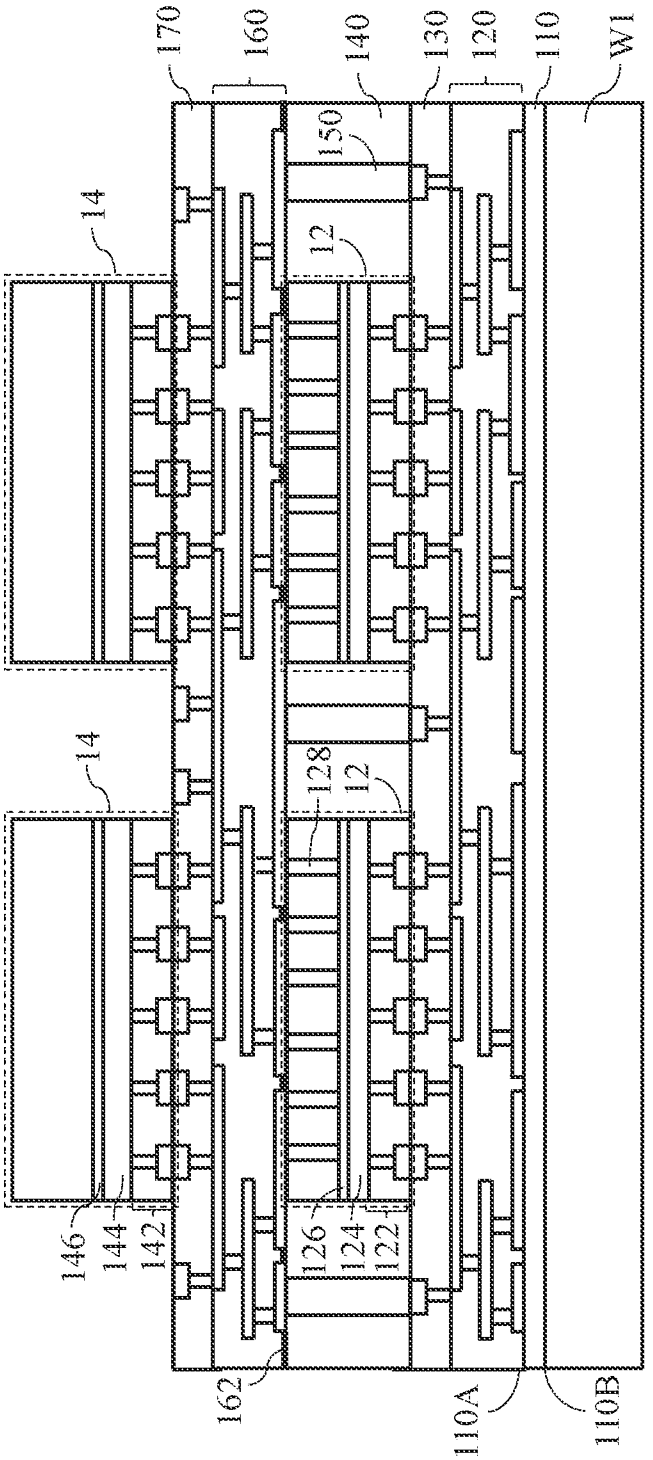

In step S170, the second bonding layer 170 for receiving the top dies 14 can be formed on the second RDL 160 as shown in FIG. 3I, and thus in step S180, the top dies 14 can be attached to the second bonding layer 170 by hybrid bonding as shown in FIG. 3J. In the present embodiments, the top dies 14 are attached to the second bonding layer 170 in a face-down manner, that is, the front sides of the top dies 14 are located in close proximity to the second bonding layer 170 and the backsides of the top dies 14 are farther away from the second bonding layer 170 compared to the front side. In such case, the top dies 14 and the bottom dies 12 are stacked in a face-to-back manner, that is, the front sides of the top dies 14 is facing the backsides of the bottom dies 12.

Figure 3K:
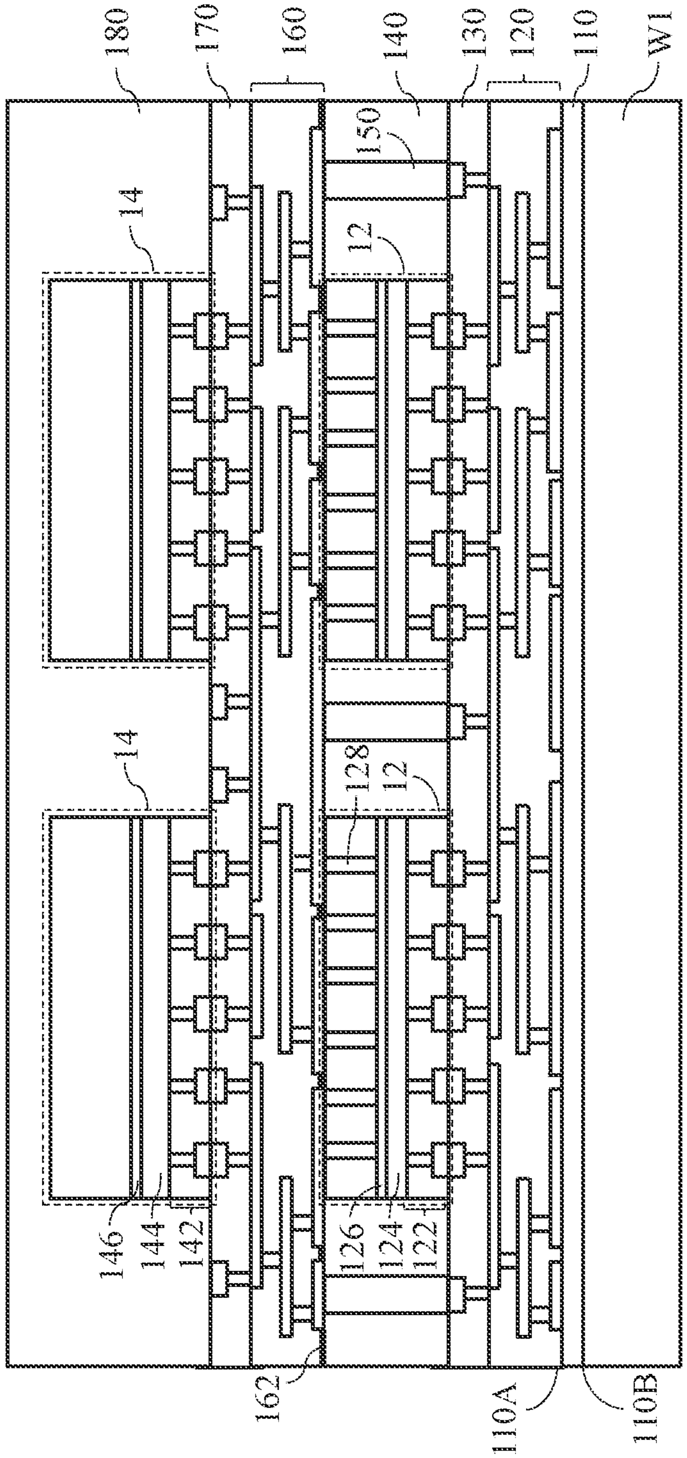
Figure 3L:
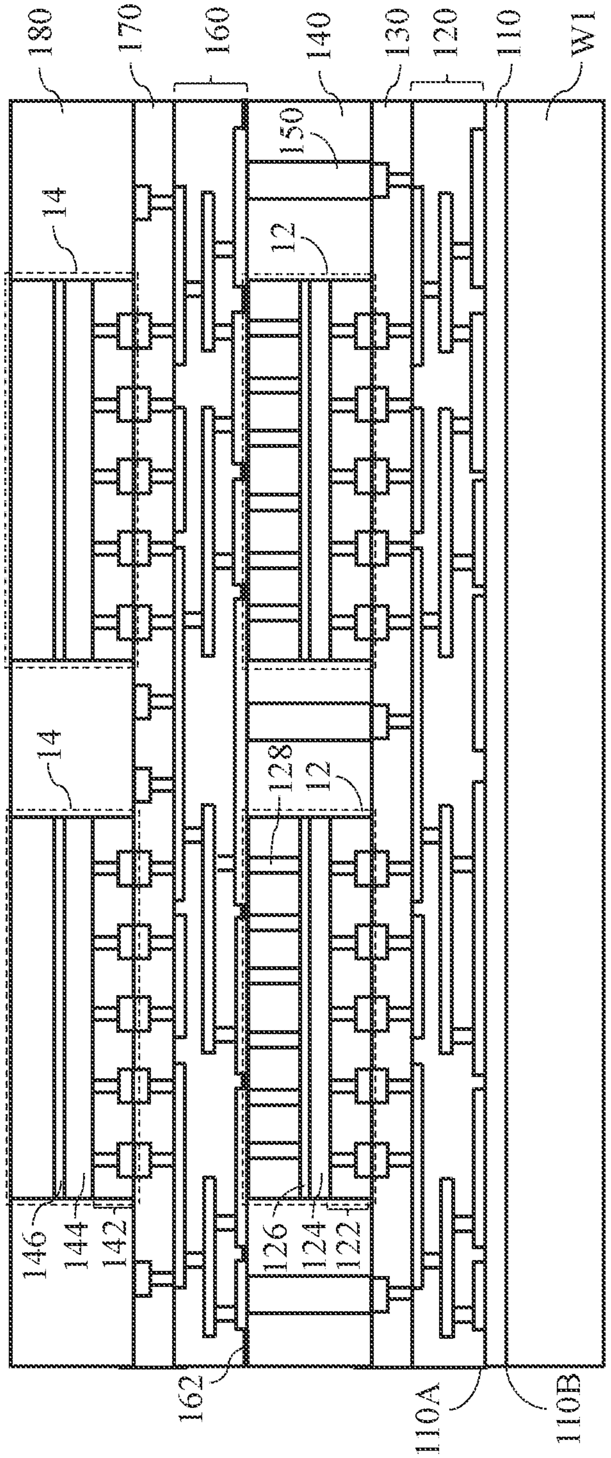

In step S182, the third dielectric layer 180 is formed on the top dies 14 to fill the gaps between the top dies 14 as shown in FIG. 3K. In some embodiments, to facilitate the formation of the third dielectric layer 180, the backsides of the top dies 14 may be grinded to be thinner before the third dielectric layer 180 is formed. After the third dielectric layer 180 is formed, the third dielectric layer 180 and backsides of the top dies 14 are further grinded to reduce the thickness as shown in FIG. 3L.

In the present embodiments, to avoid copper contamination and ensure the integrity of the semiconductor structure 100 that adopts the hybrid bonding technique, dielectric layers in the second RDL 160 and the third dielectric layer 180 may be made by dielectric material of non-polymer type. Similarly, the first RDL 120 and the second dielectric layer 140 can be made by dielectric material of non-polymer type. For example, the second dielectric layer 140, the third dielectric layer 180, dielectric layers in the first RDL 120, and dielectric layers in the second RDL 160 may include silicon oxide.

Figure 3M:
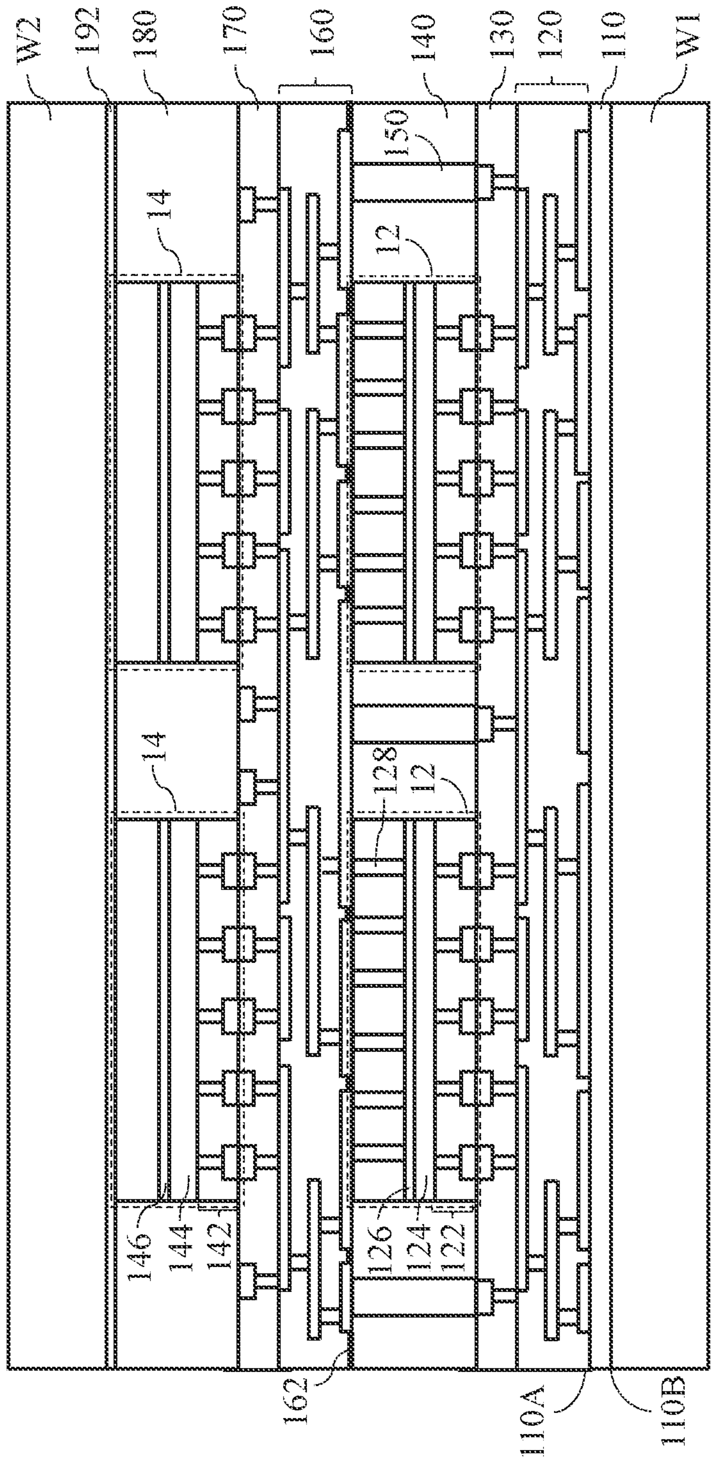

In step S190, a second silicon wafer W2 is attached to the third dielectric layer 180 and the backsides of the top dies 14. In some embodiments, the second silicon wafer 194 may be attached to the third dielectric layer 180 and the backsides of the top dies 14 with the aid of bonding dielectric layers. For example, the silicon wafer 194 may have a dielectric layer, and step S190 may be performed with sub-steps for forming another bonding dielectric layer on the third dielectric layer 180 and the backsides of the top dies 14, receiving the second silicon wafer W2, and bonding the bonding dielectric layer on the second silicon wafer W2 and the bonding dielectric layer on the third dielectric layer 180 and the backsides of the top dies 14. As a result, in FIG. 3M, a bonding dielectric layer 192 formed by the two bonding dielectric layer is presented so as to bond the second silicon wafer W2 to the third dielectric layer 180 and the backsides of the top dies 14. In the present embodiment, the second silicon wafer W2 can be a silicon lid that protecting the dies and circuits in the semiconductor structure 100.

Figure 3N:
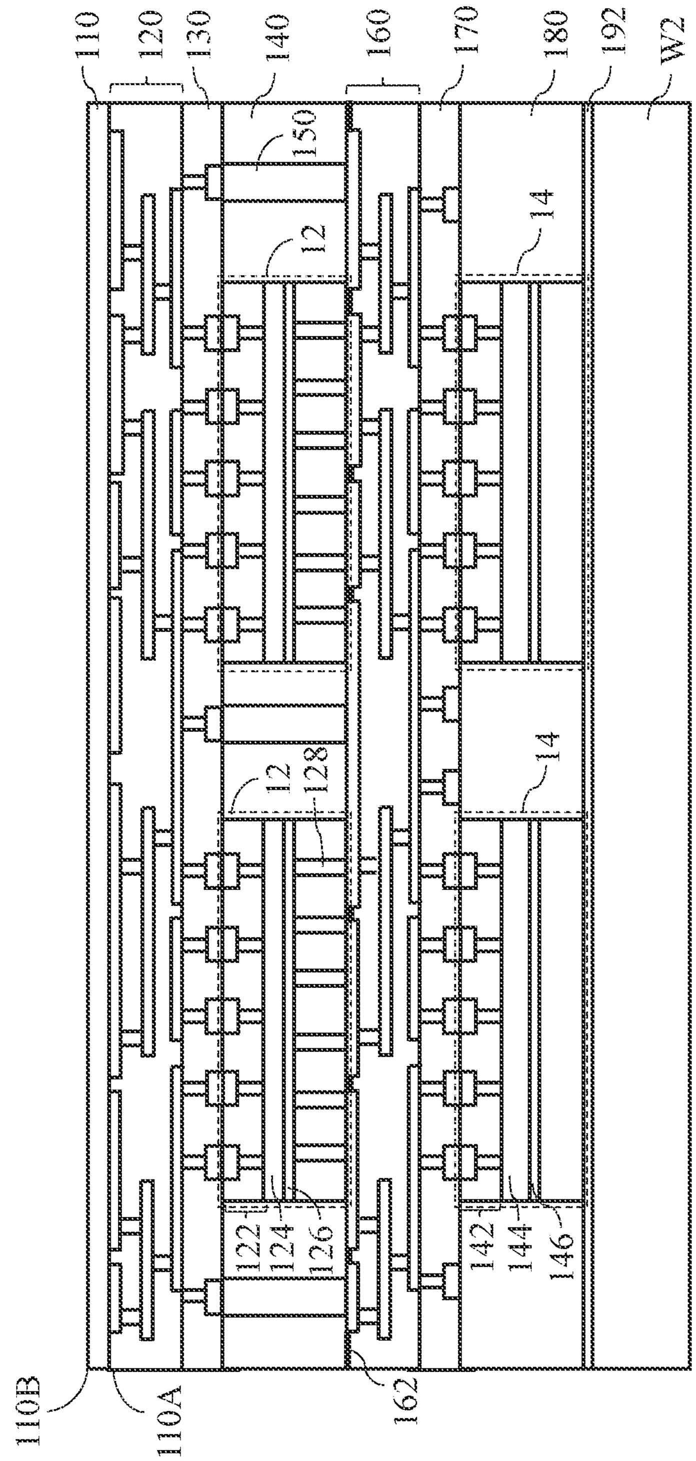
Figure 3O:
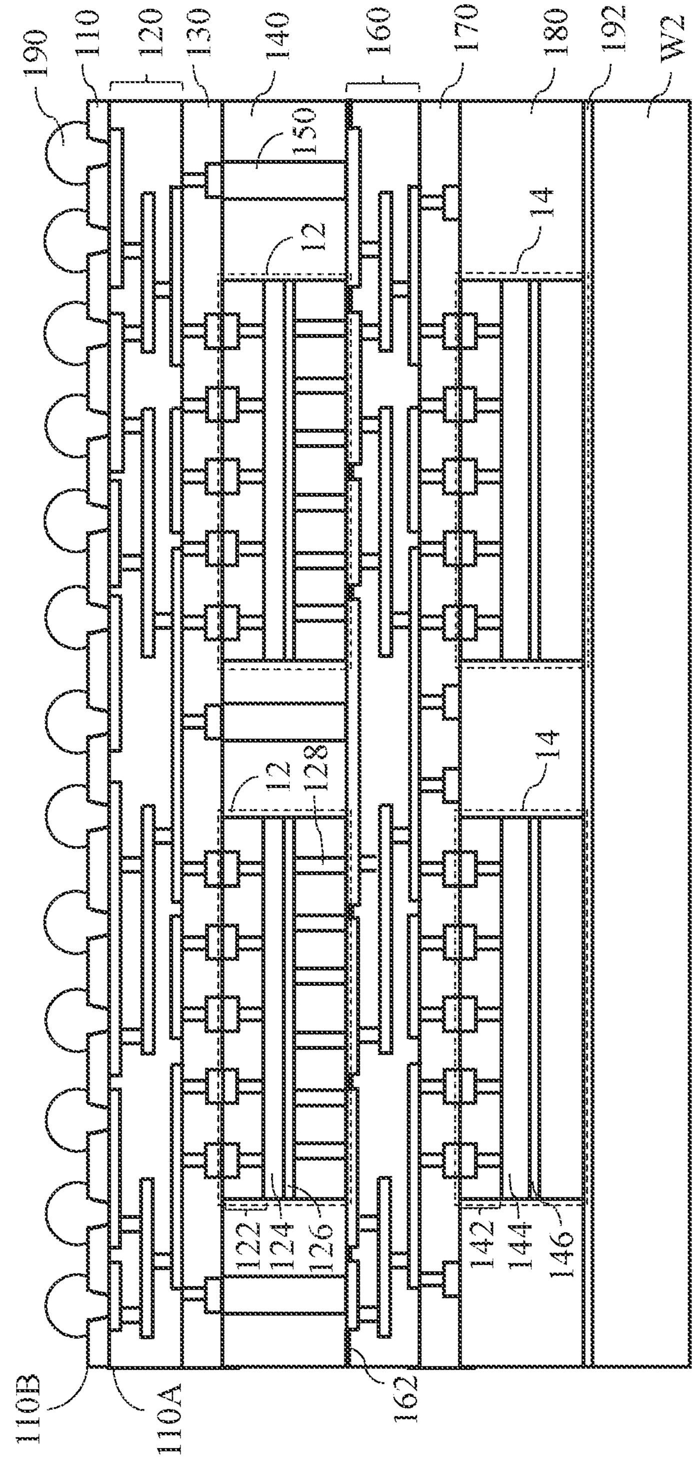

In step S192, the first silicon wafer W1 is removed, and the package 100 is flipped upside down as shown in FIG. 3N so that openings can be formed in the first dielectric layer 110. Next, in step S194, the solder bumps 190 can be formed on the second surface 110B of the first dielectric layer 110 so the solder bumps can be coupled to the first RDL 120 through the openings of the first dielectric layer 110 as shown in FIG. 3O.

Figure 4:
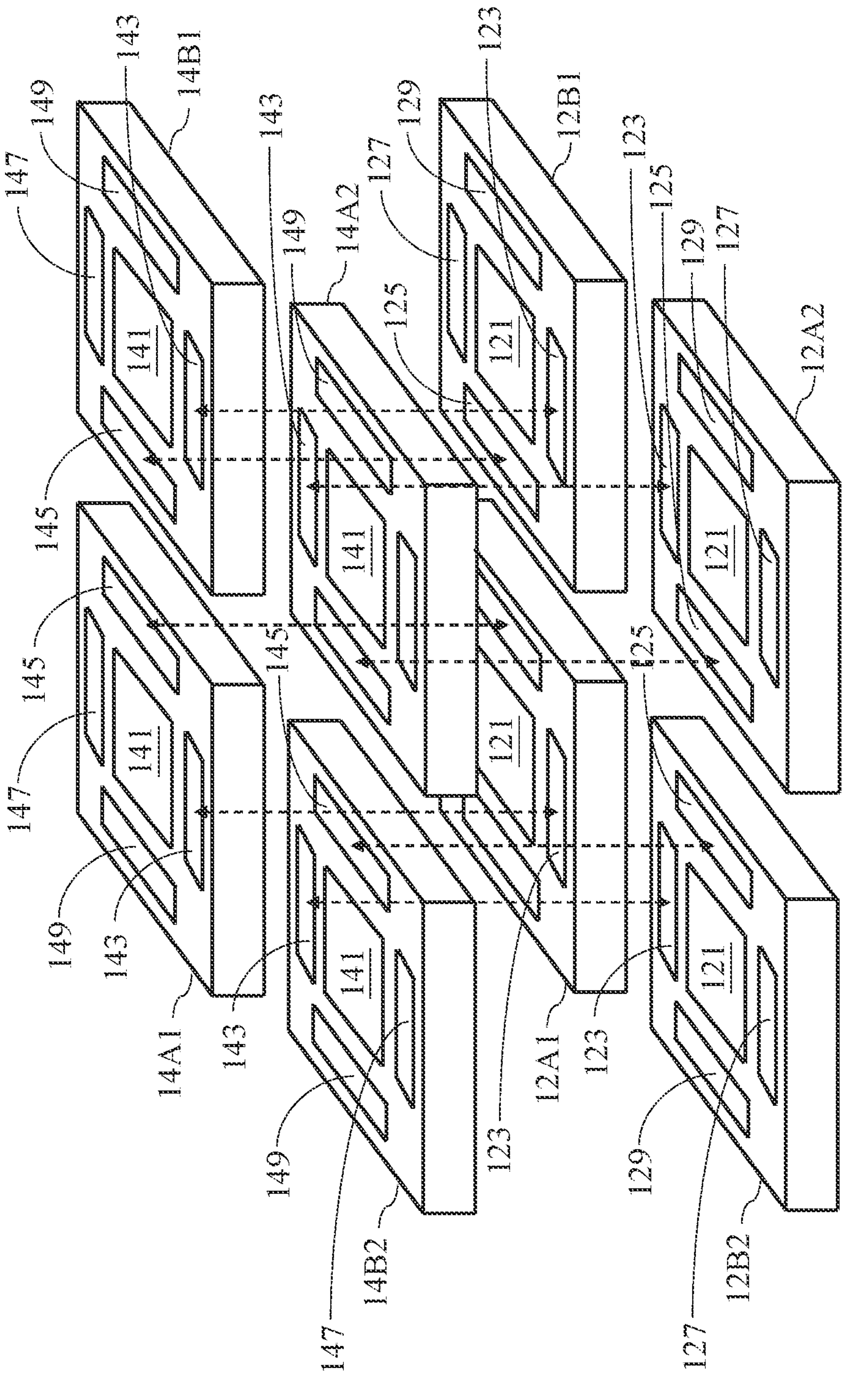
FIG. 4 shows a placement of the bottom dies and the top dies according to one embodiment of the present disclosure.

In some embodiments, a subsequent dicing procedure can be performed to singulate the semiconductor structure 100. In some embodiments, the top dies 14 and the bottom dies 12 can all be core dies that include computation circuits for performing data computations and die-to-die circuits for data transmission between dies. FIG. 4 shows a placement of the bottom dies 12 and the top dies 14. In FIG. 4, to show the placement clearly, components besides the bottom dies 12 and the top dies 14 are not shown. As shown in FIG. 4, the bottom dies 12 of the semiconductor structure 100 may include four bottom dies 12A1, 12A2, 12B1, and 12B2. The bottom dies 12A1, 12A2, 12B1, and 12B2 have the same functions but may have different placements of circuits. In the present embodiment, the two bottom dies 12A1 and 12A2 are of a first type and the two bottom dies 12B1 and 12B2 are of a second type. That is, the bottom dies 12A1 and 12A2 are identical, and can be manufactured with the same set of reticles. Similarly, the bottom dies 12B1 and 12B2 are identical and can be manufactured with another set of reticles.

As shown in FIG. 4, each of the bottom dies 12A1, 12A2, 12B1, and 12B2 includes a computation circuit 121, two die-to-die connection circuits 123 and 125, an input/output circuit 127 and a physical interface circuit 129. The computation circuit can include one or more processors for data computing. The die-to-die connection circuits 123 and 125 can manage the signal transmission between dies, the input/output circuit 127 can convert the analog signals into digital signals and convert the digital signals into analog signals for receiving and transmitting external signals of the semiconductor structure 100. The physical interface circuit 129 can be a memory interface or a memory controller for assisting the computation circuit 121 to access the external memory.

The die-to-die connection circuits 123 and 125, the input/output circuit 127 and the physical interface circuit 129 are placed along four edges of each of the bottom dies 12A1, 12A2, 12B1, and 12B2, and the computation circuit 121 is surrounded by the die-to-die connection circuit 123 and 125, the input/output circuit 127 and the physical interface circuit 129.

Furthermore, in the present embodiments, the two bottom dies 12A1 and 12A2 of the first type and the two bottom dies 12B1 and 12B2 of the second type are disposed in a staggered manner so that every die-to-die connection circuits 123 and 125 of every bottom die is adjacent to another die-to-die connection circuit 123 or 125 of another bottom die. For example, the die-to-die connection circuit 123 of the bottom die 12A1 is adjacent to the die-to-die connection circuit 123 of the bottom die 12B2, and the die-to-die connection circuit 125 of the bottom die 12B2 is adjacent to the die-to-die connection circuit 125 of the bottom die 12A2.

Since the die-to-die connection circuits 123 and 125 of different bottom dies 12A1, 12A2, 12B1, and 12B2 are placed adjacent to each other, the routing paths formed in the first RDL 120 for data sharing between different bottom dies can be shortened, thereby increasing the transmission efficiency and reducing the routing complexity.

Similarly, the top dies 14 of the semiconductor structure 100 may include four top dies 14A1, 14A2, 14B1, and 14B2. The top dies 14A1, 14A2, 14B1, and 14B2 have the same functions but may have different placements of circuits. In the present embodiment, the two top dies 14A1 and 14A2 are of a first type, and the two top dies 14B1 and 14B2 are of a second type. That is, the top dies 14A1 and 14A2 are identical, and can be manufactured with the same set of reticles. Similarly, the top dies 14B1 and 14B2 are identical, and can be manufactured with another set of reticles. In some embodiments, the bottom dies 12A1 and 12A2 and the top dies 14A1 and 14A2 are identical, and can be manufactured with the same set of reticles. Also, the bottom dies 12B1 and 12B2 and the top dies 14B1 and 14B2 are identical, and can be manufactured with the same set of reticles.

In the present embodiment, each of the top dies 14A1, 14A2, 14B1, and 14B2 includes a computation die 141, two die-to-die connection circuits 143 and 145, an input/output circuit 147 and a physical interface circuit 149. The die-to-die connection circuits 143 and 145, the input/output circuit 147 and the physical interface circuit 149 are placed along four edges of each of the top dies 14A1, 14A2, 14B1, and 14B2, and the computation circuit 141 is surrounded by the die-to-die connection circuit 143 and 145, the input/output circuit 147 and the physical interface circuit 149.

Furthermore, in the present embodiments, the two top dies 14A1 and 14A2 of the first type and the two top dies 14B1 and 14B2 of the second type are disposed in a staggered manner so that every die-to-die connection circuits 143 and 145 of every top die is adjacent to another die-to-die connection circuit 143 or 145 of another top die. For example, the die-to-die connection circuit 143 of the top die 14A1 is adjacent to the die-to-die connection circuit 143 of the bottom die 14B2, and the die-to-die connection circuit 145 of the bottom die 14A1 is adjacent to the die-to-die connection circuit 145 of the bottom die 14B1.

Since the die-to-die connection circuits 143 and 145 of different top dies 14A1, 14A2, 14B1, and 14B2 are placed adjacent to each other, the routing paths formed in the second RDL 160 for data sharing between different top dies can be shortened, thereby increasing the transmission efficiency and reducing the routing complexity.

In addition, in the present embodiments, from a top view, the die-to-die connection circuits 143 and 145 of the top dies 14A1, 14A2, 14B1, and 14B2 are aligned with the die-to-die connection circuits 123 and 125 of the bottom dies 12A1, 12A2, 12B1, and 12B2. For example, as shown in FIG. 4, the die-to-die connection circuit 143 of the top die 14A1 is aligned with the die-to-die connection circuit 123 of the bottom die 12A1, and the die-to-die connection circuit 145 of the top die 14B2 is aligned with the die-to-die connection circuit 145 of the bottom die 12B2. In such case, the top dies 14A1, 14A2, 14B1, and 14B2 can be coupled to the bottom dies 12A1, 12A2, 12B1, and 12B2 through the respective die-to-die connection circuits 123, 125, 143, and 145 with shorter routing paths provided by the second RDL 160 vertically. That is, the semiconductor structure 100 allow data sharing between two top dies, between two bottom dies, and between a top die and a bottom die, thereby improving the overall computing efficiency.

In addition, in some embodiments, to form the first RDL 120 with the conductive traces for connecting the die-to-die connection circuits 123 and 125 of the bottom dies 12A1, 12A2, 12B1, and 12B2, the reticle stitching technique may be adopted. That is, the step S130 may include performing lithography processes by stitching a plurality of reticles (i.e., the lithography masks). Similarly, the first bonding layer 130 may also be formed with mask stitching technique.

For example, currently, the largest reticle available may have a size about 26 mm×33 mm. In such case, if each of the bottom dies 12A1, 12A2, 12B1, and 12B2 has a size about half of the size of the largest reticle, then the first RDL 120 may be formed by stitching two reticles having the largest size. In such case, the semiconductor structure 100 may have a size about 52 mm×33 mm.

Figure 5:
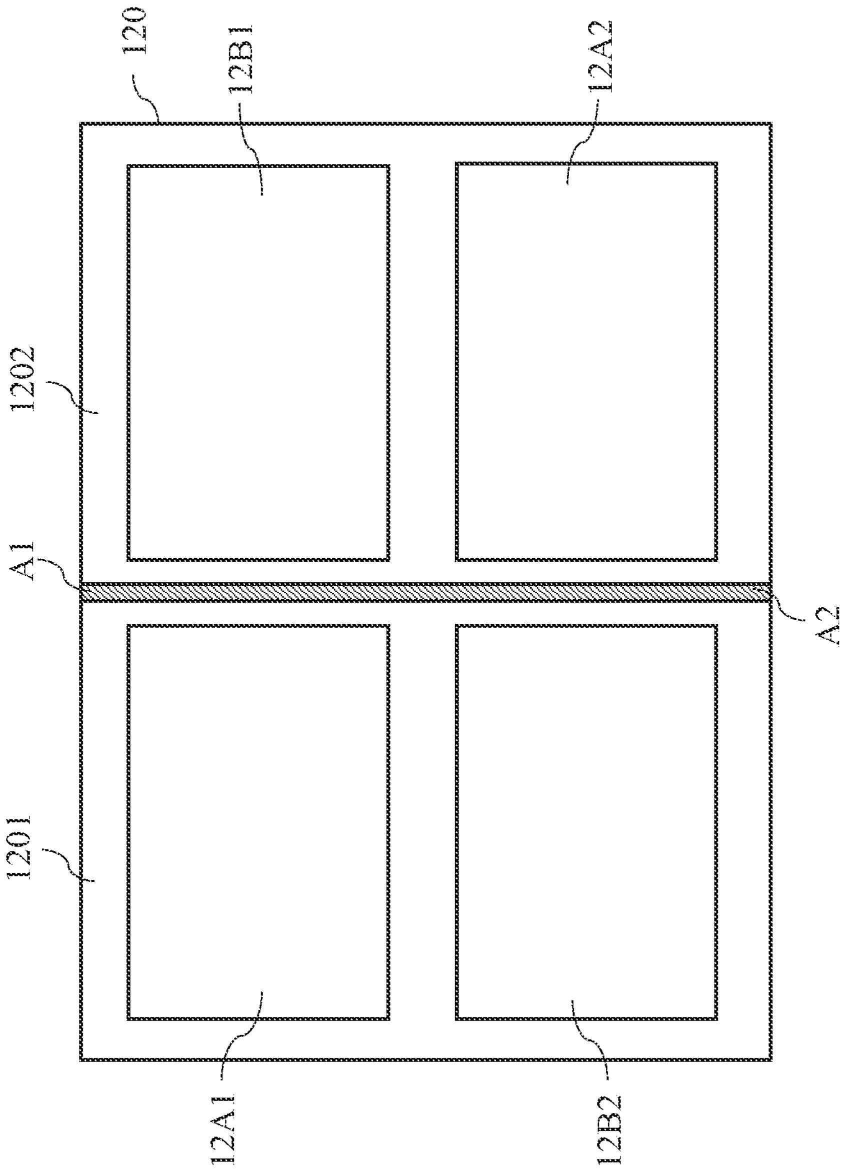
FIG. 5 shows a top view of the bottom dies and the first RDL formed by stitching reticles according to one embodiment of the present disclosure.

FIG. 5 shows a top view of the bottom dies 12A1, 12A2, 12B1, and 12B2 and the first RDL 120 formed by stitching reticles according to one embodiment of the present disclosure. As shown in FIG. 5, the first RDL 120 (the first bonding layer 130 is not shown) can be formed by using two sets of reticles (masks). For example, the first RDL 120 may include two reticle regions 1201 and 1202 that are formed by two different sets of reticles, and thus, the reticle region 1201 may have an interconnect layout pattern different from an interconnect layout pattern of the reticle region 1202. In the present embodiment, the reticle region 1201 is adjacent to the second reticle region 1202. In addition, from a top view, the reticle region 1201 overlaps with the bottom dies 12A1 and 12B2, and the reticle region 1202 overlaps with the bottom dies 12B1 and 12A2 as shown in FIG. 5.

Furthermore, in some embodiments, to ensure the traces crossing different reticle regions can be aligned without interrupted, an overlapping region A1 of the reticle region 1201 and an overlapping region A2 of the reticle region 1202 that are overlapping each other may have the same interconnect layout pattern. Also, conductive traces that traverse the boundary between the reticle region 1201 and the reticle region 1202 should traverse the boundary along a direction perpendicular to the boundary. In addition, to ensure the integrity of the first RDL 120, no vias are allowed in the overlapping regions A1 and A2 of the reticle regions 1201 and 1202. In the present embodiment, the same rule can be applied when forming the first bonding layer 130 with stitching masks.

Due to the respective overlapping regions A1 and A2 in the reticle regions 1201 and 1202, the actual sizes of the semiconductor structure 100 may be a bit smaller than the total size of the two reticles. In addition, since the spaces between bottom dies 12A1, 12A2, 12B1, and 12B2 should be preserved for the conductive traces for connecting the adjacent top dies, the size of the bottom dies 12A1, 12A2, 12B1, and 12B2 may be smaller than the half size of the reticle.

In the present embodiments, the second bonding layer 170 and the second RDL 180 may also be formed by stitching masks. For example, the second RDL 180 may include two reticle regions formed by using two different reticles respectively. In addition, the conductive pillars 150 and the solder bumps 190 may also be formed with stitching masks.

Figure 6:
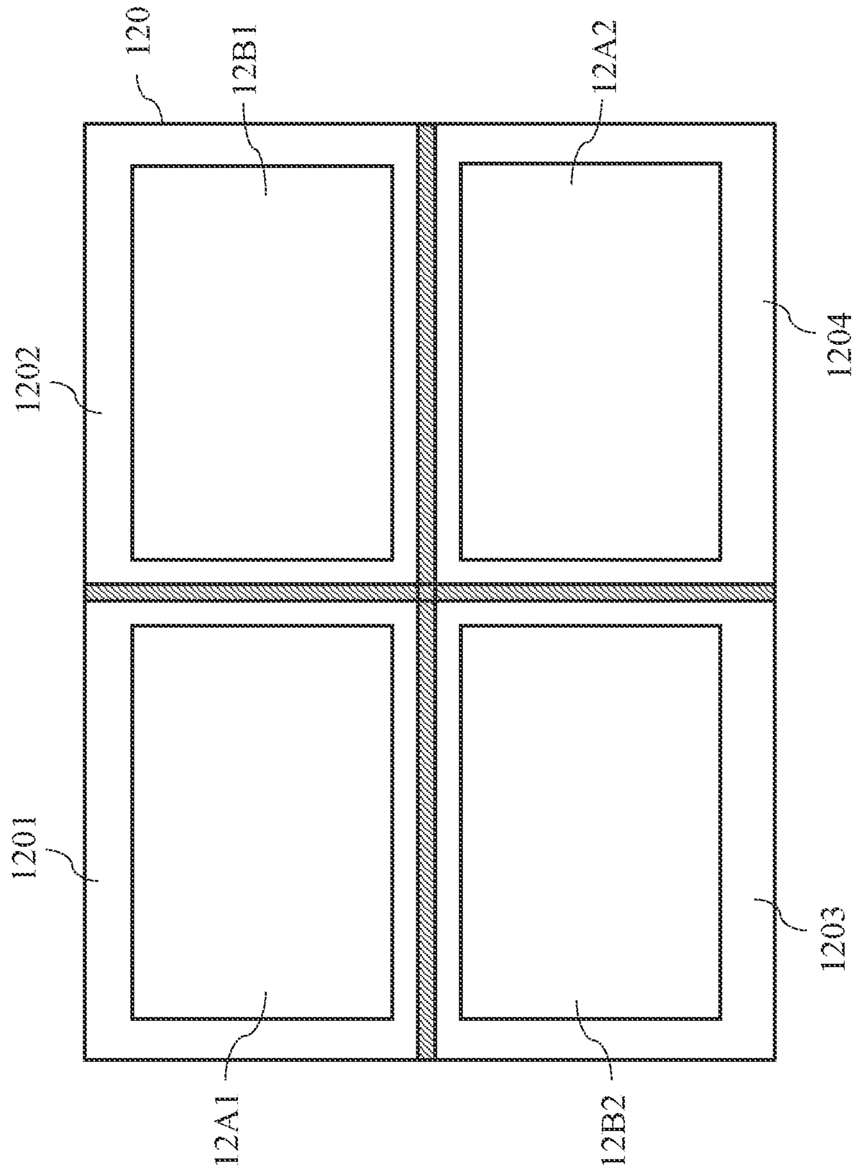
FIG. 6 shows a top view of bottom dies and the first RDL formed by stitching four reticles according to another embodiment of the present disclosure.

Although the RDLs 120 and 160 can be formed by stitching two reticles in the present embodiment, the present disclosure is not limited thereto. In some other embodiments, the designer may stitching even more reticles if necessary. FIG. 6 shows a top view of bottom dies 12A1, 12A2, 12B1, and 12B2 and the first RDL 120 formed by stitching four reticles according to another embodiment of the present disclosure. As shown in FIG. 6, the bottom dies 12A1, 12A2, 12B1, and 12B2 can have a size about the same as the size of the reticles (e.g., 26 mm×33 mm). In such case, the first RDL 120 can include four reticle regions 1201, 1202, 1203, and 1204 that have different interconnect layout patterns. Also, each of the reticle regions 1201, 1202, 1203, and 1204 may overlap one of the bottom dies 12A1, 12A2, 12B1, and 12B2 respectively. As a result, the semiconductor structure 100 can have a size about 52 mm×66 mm. However, like the embodiment shown in FIG. 5, the reticle regions 1201, 1202, 1203, and 1204 shown in FIG. 6 may also include overlapping regions so as to ensure the integrity of the conductive traces in the first RDL 120.

Figure 7:
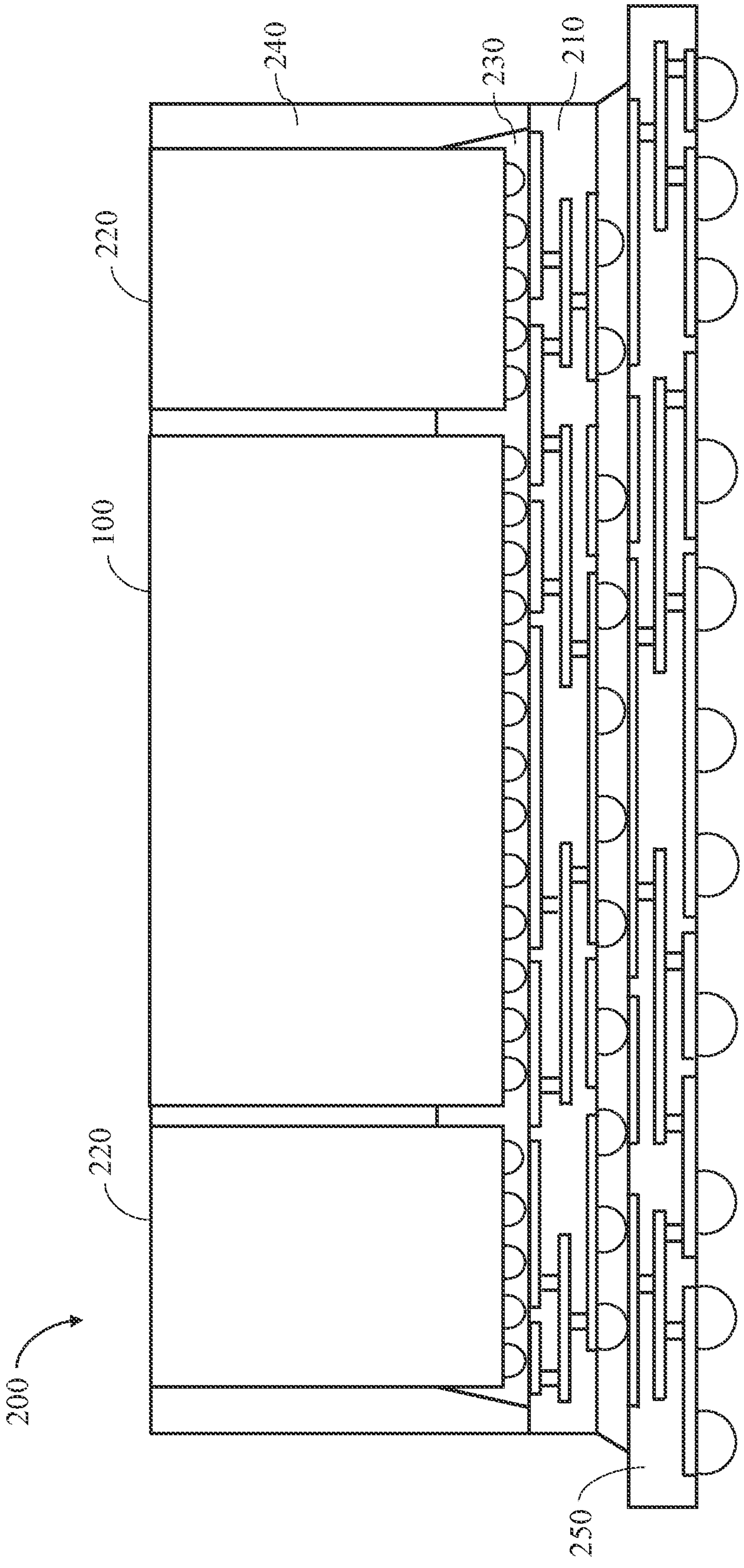
FIG. 7 shows a semiconductor package according to another embodiment of the present disclosure
Figure 8:
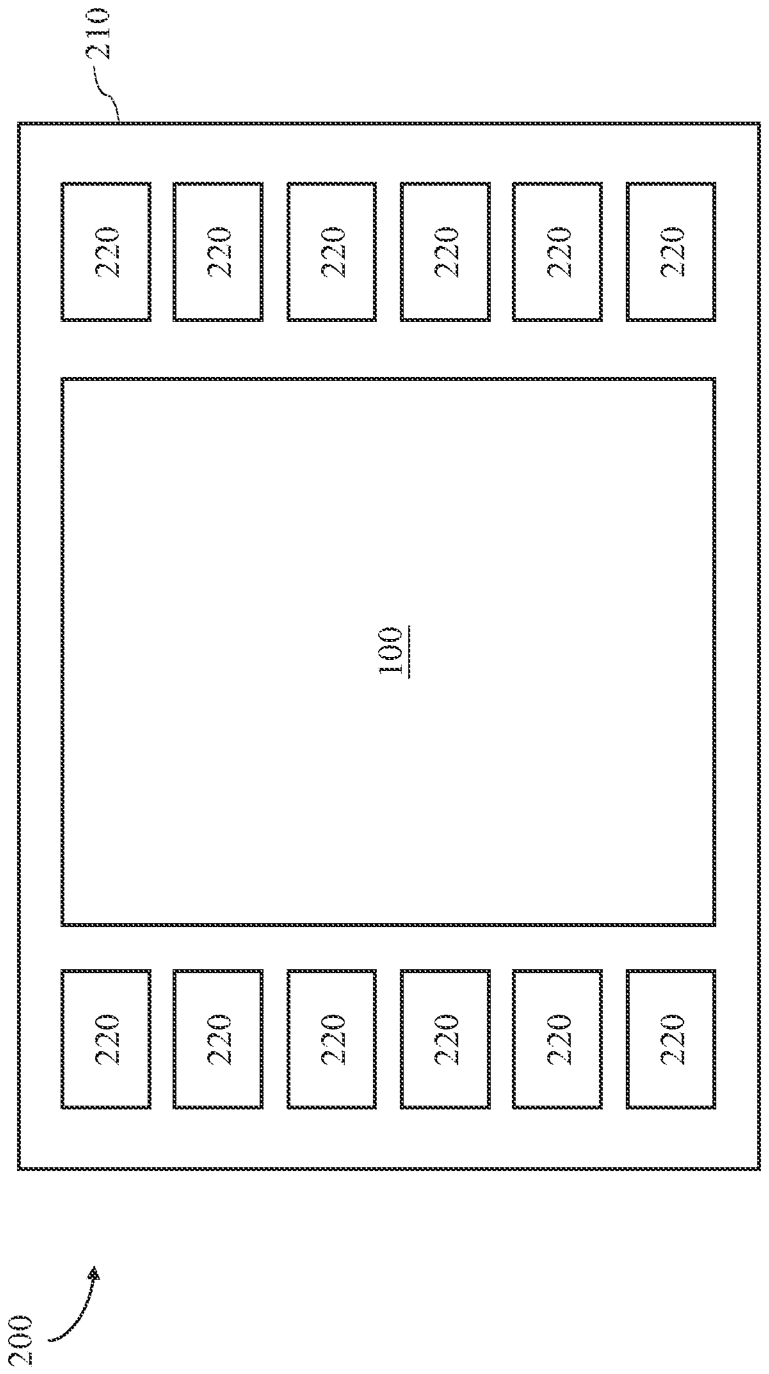
FIG. 8 shows a placement of the semiconductor package in FIG. 7 from a top view.

In the present embodiment, the bottom dies 12A1, 12A2, 12B1, and 12B2 and the top dies 14A1, 14A2, 14B1, and 14B2 may all be chiplets that each includes at least one computation core, so the semiconductor structure 100 can integrate greater computation power of multi-core (e.g., 8 cores) within a small area. In some embodiments, the semiconductor structure 100 can be alone seen as a wafer level semiconductor package, however, in some other embodiments, the semiconductor structure 100 may further be packaged with memory dies. FIG. 7 shows a semiconductor package 200 according to another embodiment of the present disclosure, and FIG. 8 shows a placement of the semiconductor package 200 from a top view.

As shown in FIG. 7, the semiconductor package 200 includes the semiconductor structure 100, an interposer 210, and a plurality of high bandwidth memories (HBMs) 220. The semiconductor structure 100 and the HBMs 220 are disposed on the interposer 210, and the HBMs 220 can surround the semiconductor structure 100. In such case, the bottom dies 12 and the top dies 14 in the semiconductor structure 100 can be coupled to the HBMs 220 through the interconnect paths provided by the interposer 210.

In the present embodiment, the semiconductor structure 100 and the HBMs 220 can be soldered to the interposer 210, and underfills 230 can be applied to protect the soldering structures of the semiconductor structure 100 and the HBMs 220 (e.g., the solder bumps of the semiconductor structure 100 and the HBMs 220). However, the present disclosure is not limited thereto. In some other embodiments, the semiconductor structure 100 and the HBMs 220 may be bonded to the interposer 210 by hybrid bonding so as to further reduce the resistance on the transmission paths and facilitate the thermal dissipation.

Furthermore, a molding compound 240 can also be applied to mold the semiconductor structure 100 and the HBMs 220. Finally, the interposer 210 can be soldered to a substrate 250, and thus, the semiconductor package 200 can be formed in a 2.5D manner. In some embodiments, the interposer 210 may also be formed with the mask stitching technique so as to form the routing paths for connecting the semiconductor structure 100 and the HBMs 200 and the input/output paths for the semiconductor structure 100 and the HBMs 200.

Although the semiconductor structure 100 shown in FIG. 4 includes 8 dies that have same functions, the present disclosure is not limited thereto. In some other embodiments, the semiconductor structure 100 may include more dies and may include dies of different functions. For example, the computation circuits 121, the input/output circuit 127, and the physical interface circuit 129 in the bottom die 12A1 shown in FIG. 4 may be each formed by a smaller die, so as to further reduce the sizes of the dies 12 and 14 and increase the yield rates.

Figure 9:
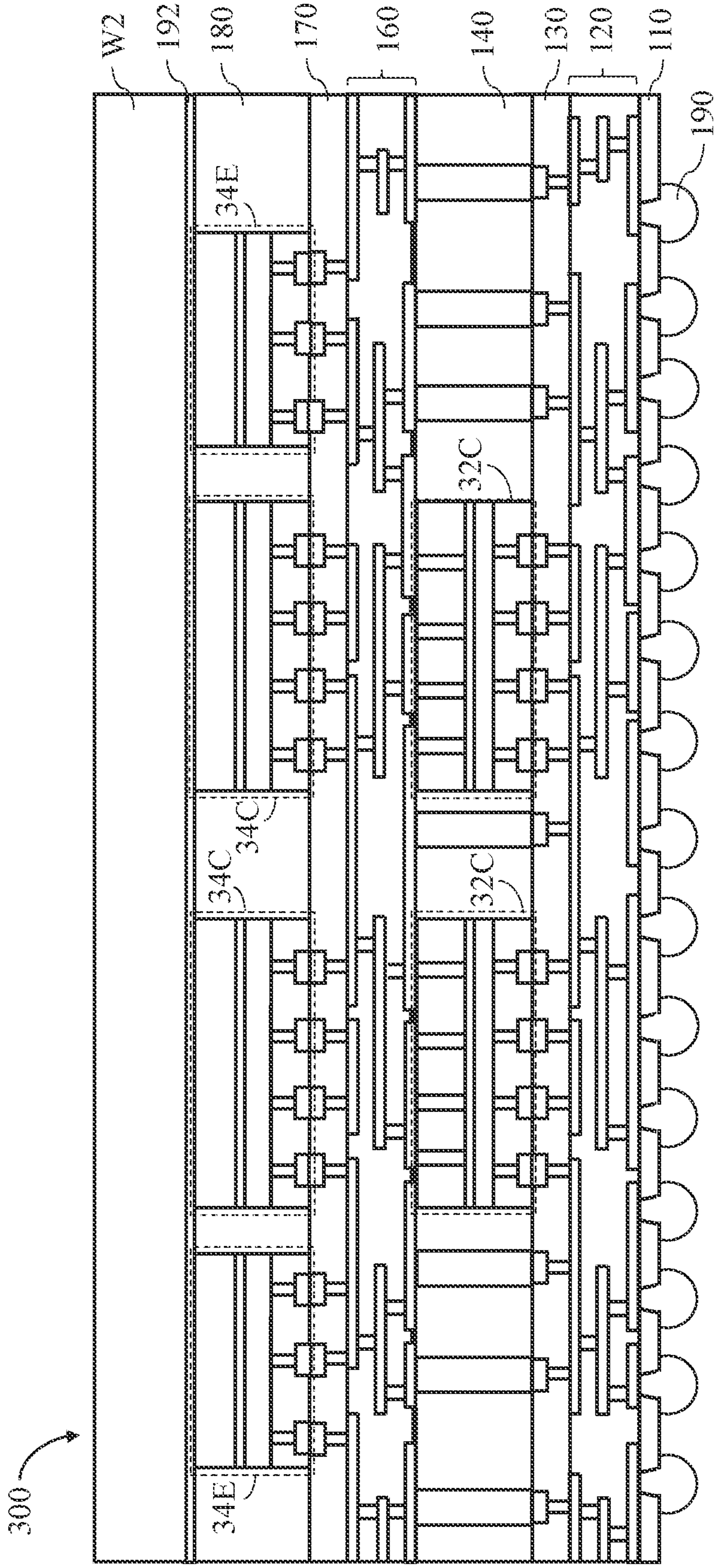
FIG. 9 shows a semiconductor structure according to another embodiment of the present embodiment.
Figure 10:
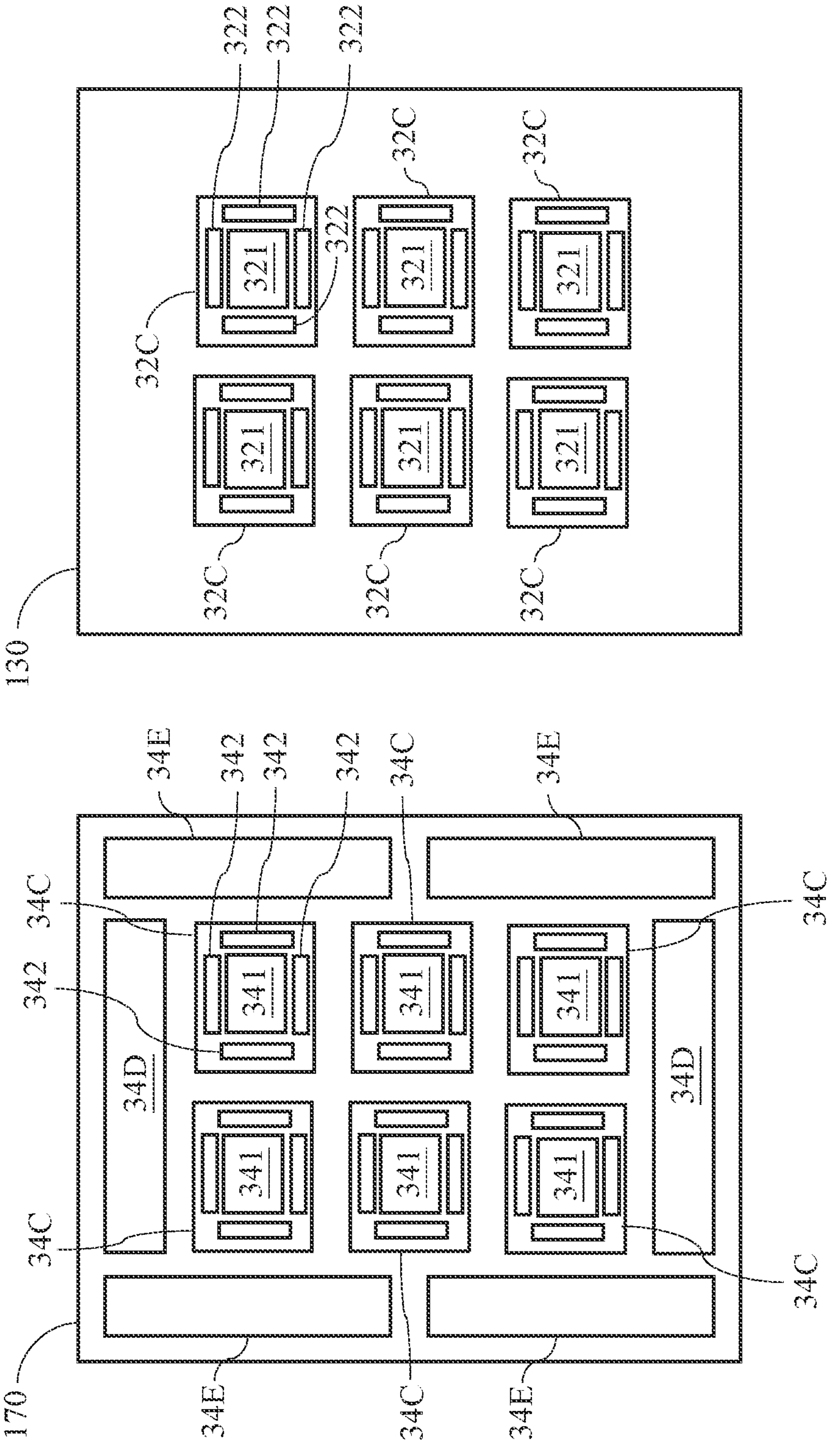
FIG. 10 shows the placement of the bottom dies and the top dies in the semiconductor structure in FIG. 9.

FIG. 9 shows a semiconductor structure 300 according to another embodiment of the present embodiment. The semiconductor structure 300 and the semiconductor structure 100 have similar structures and can be manufactured by similar methods, such as the method M1 shown in FIGS. 2A and 2B. However, the semiconductor structure 300 includes dies of different functions. FIG. 10 shows the placement of the bottom dies 32C and the top dies 34C, 34D and 34E in the semiconductor structure 300.

As shown in FIG. 10, the top dies 34C, 34D and 34E include a plurality of top computing dies 34C, a plurality of input/output dies 34D, and a plurality of physical interface dies 34E. Also, the bottom dies 32C are computing dies. The top computing dies 34C and the bottom computing dies 32C may have the same functions and can respectively include computation circuits 341 and 321 for performing the computations required for the applications. In some embodiments, the top computing dies 34C and the bottom computing dies 32C can have same structures and can be manufacturing by same set of reticles.

The input/output dies 34D may include the input/output circuit 127 or 147 shown in FIG. 4, and the physical interface dies 34E may include the physical interface circuit 129 or 149 shown in FIG. 4. Furthermore, as shown in FIG. 10, the input/output dies 34D and the physical interface dies 34E can surround the top computing dies 34C on the second bonding layer 170. In such case, the top computing dies 34C can be coupled to the input/output dies 34D and the physical interface dies 34E through the second RDL 160 with shorter paths. Also, the adjacent top computing dies 34C can be coupled to each other through the second RDL 160, and adjacent bottom dies 32C can be coupled to each other through the first RDL 120. Therefore, data sharing between bottom computing dies 32C and between top computing dies 34C are both allowed in the semiconductor structure 300.

Furthermore, each of the top computing dies 34C may include at least one die-to-die connection circuit 342, and each of the bottom computing dies 32C may include at least one die-to-die connection circuit 322. From a top view, the die-to-die connection circuits 342 of the top computing dies 34C can be aligned with the die-to-die connection circuits 322 of the bottom computing dies 32C. Therefore, the bottom computing dies 32C can be coupled to the corresponding top computing dies 34C vertically with the aids of the second RDL 160 through the die-to-die connection circuits 322 and the die-to-die connection circuits 342. In such case, the semiconductor structure 300 further allows data sharing between the top computing dies 34C and the bottom computing dies 32C.

In the present embodiment, since the input/output dies 34D and the physical interface dies 34E are the top dies that are bonded to the second bonding layer 170 on the second RDL 160, the heat generated by the input/output dies 34D and the physical interface dies 34E can be dissipated through the top of the semiconductor structure 300 more easily, thereby alleviating the thermal concerns of the semiconductor structure 300. Furthermore, by placing the input/output dies 34D and the physical interface dies 34E at the top of the stacking structure also leaves more space for placing the conductive pillars 150 so as to reduce the routing complexity. However, the present disclosure is not limited thereto. In some other embodiments, the input/output dies 34D and the physical interface dies 34E may also be at the bottom of the stacking structure.

Figure 11:
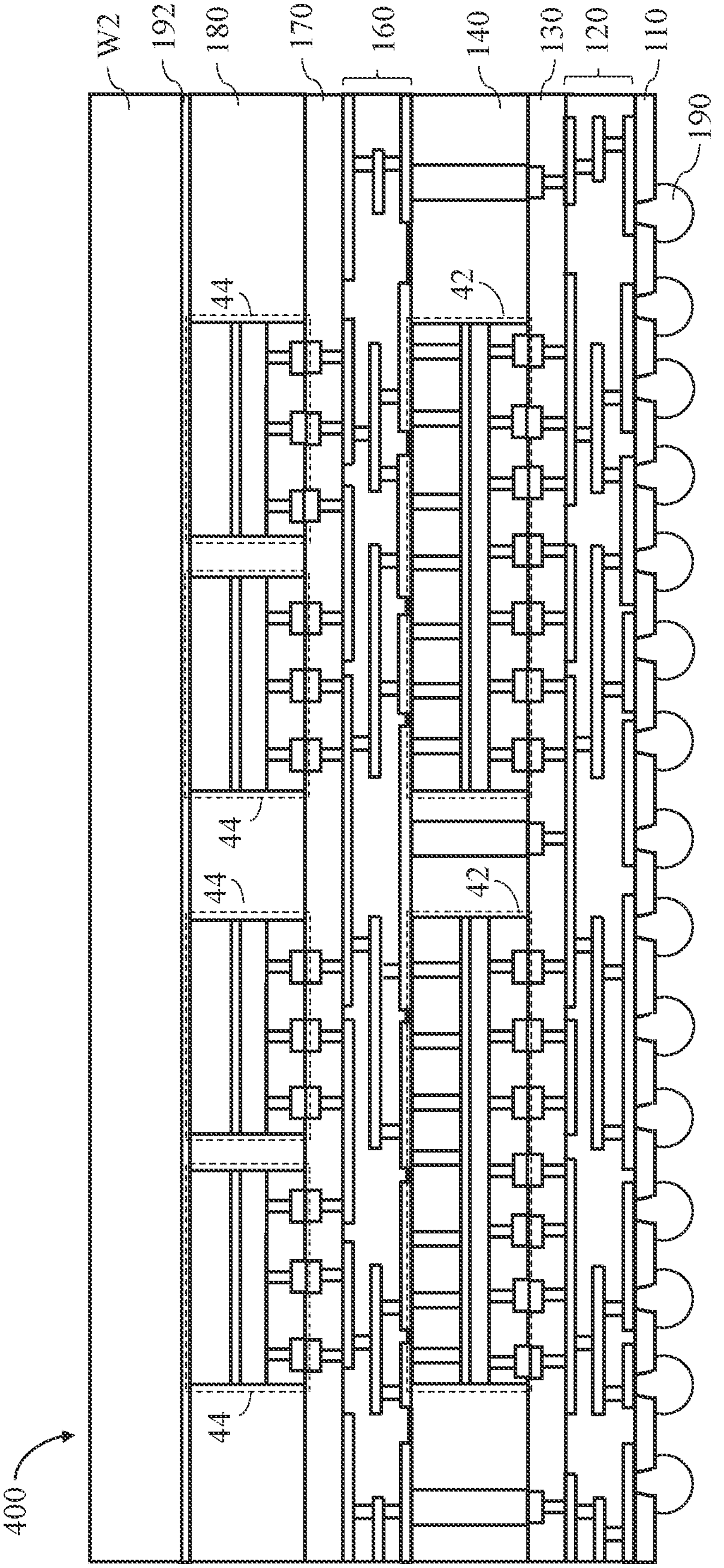
FIG. 11 shows a semiconductor structure according to another embodiment of the present embodiment.
Figure 12:
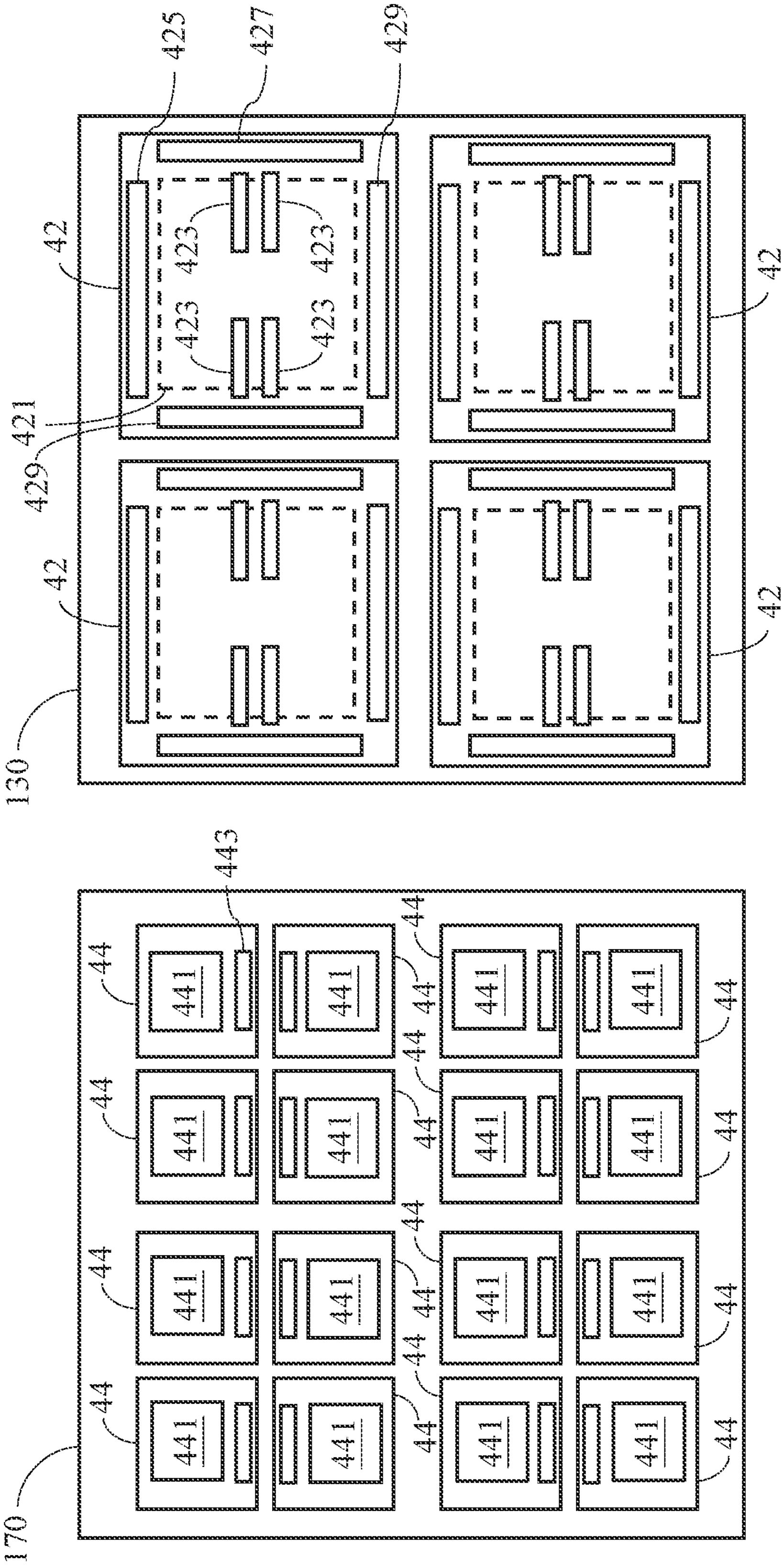
FIG. 12 shows the placement of the bottom dies and the top dies in the semiconductor structure in FIG. 11.

FIG. 11 shows a semiconductor structure 400 according to another embodiment of the present embodiment. The semiconductor structure 400 and the semiconductor structure 100 have similar structures and can be manufactured by similar methods, such as the method M1 shown in FIGS. 2A and 2B. However, the semiconductor structure 400 includes dies of different functions. FIG. 12 shows the placement of the bottom dies 42 and the top dies 44 in the semiconductor structure 400.

In the present embodiment, the top dies 44 may be the computing dies, and each of the top dies 44 may include a computation circuit 441, and a die-to-die connection circuit 443. The computation circuit 441 is for performing the computations required for the applications, and the die-to-die connection circuit 443 is for managing the connection between dies. Each of the bottom dies 42 may include a memory circuit 421, a plurality of die-to-die connection circuits 423, an input/output circuit 425, and a physical interface circuit 427. In some embodiments, the memory circuit 421 may be static random access memory (SRAM).

Furthermore, from a top view, the die-to-die connection circuits 443 of the top dies 44 are aligned with the die-to-die connection circuits 423 of the bottom dies 42. In such case, the top dies 44 can be coupled to the bottom dies 42 through the die-to-die connection circuits 443 and 423 vertically with the aid of the second RDL 160. Therefore, the computation circuit 441 of the top dies 44 can access the memory circuit 421 of the bottom die 42 for more storage spaces, and can utilize the input/output circuit 425 of the bottom die 42 for receiving signals from external and transmitting signals to external. Also, the computation circuit 441 of the top dies 44 may utilize the physical interface circuit 427 of the bottom dies 42 to access the external memory, such as the external dynamic random access memory (DRAM).

In addition, to enable the data sharing between the bottom dies 42, each of the bottom dies 42 may further include a plurality of die-to-die connection circuits 429. The die-to-die connection circuits 429 can be disposed along edges of the bottom dies 42, and by properly placed, each of the die-to-die connection circuits 429 of a bottom die 42 can be adjacent to a die-to-die connection circuits 429 of another bottom die 42. Therefore, the connecting paths between the two adjacent bottom dies 42 can be shortened. In the present embodiment, the input/output circuit 425 and the physical interface circuit 427 can also be disposed along edges of the bottom dies 42. Also, by properly placed, the input/output circuit 425 and the physical interface circuit 427 can be disposed along the outlines of the semiconductor structure 400, thereby facilitating the external routing of the bottom dies 42.

In the present embodiment, each of the semiconductor structures 300 and 400 can be seen as a wafer level package like the semiconductor structure 100. It may also be noted that while the semiconductor structure 100 includes fewer dies of the same function, the semiconductor packages 200 and 300 may include more dies have different functions. In some embodiments, the semiconductor structures 300 and 400 can be seen as a system on wafer (SoW). Also, the semiconductor structures 300 and 400 may have a larger size than the semiconductor structure 100. For example, the size of the semiconductor structures 300 and 400 can be up to 200 mm×200 mm. In such case, each wafer may be used to form only one or two semiconductor structure 300 or 400.

In summary, the semiconductor package and the method for manufacturing the semiconductor package provided by the embodiments of the present disclosure allows the designer to embed more computation power within one package. Also, since the top dies and the bottom dies can be coupled through the RDL in between, flexible routing among different dies can be achieved, thereby improving the efficiency of data sharing and/or data access. Furthermore, since the top dies and the bottom dies can be bonded to the RDL by hybrid bonding, the transmission resistance can be reduced and the thermal issue can be mitigated, which can be a significant improvement for applications requiring massive computations such as artificial intelligence.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor package comprising:
a first dielectric layer;
a first redistribution layer (RDL) disposed on a first surface of the first dielectric layer;
a first bonding layer disposed on the first RDL;
a plurality of bottom dies having bonding layers attached to the first bonding layer;
a second dielectric layer filling gaps between the bottom dies;
a plurality of conductive pillars disposed in the second dielectric layer without contacting the bottom dies;

a second RDL disposed on the second dielectric layer and coupled the conductive pillars and a plurality of through silicon vias (TSVs) formed in backsides of the bottom dies;

a second bonding layer disposed on the second RDL;

a plurality of top dies having bonding layers attached to the second bonding layer;

a third dielectric layer filling gaps between the top dies; and a plurality of solder bumps disposed on a second surface of the first dielectric layer and coupled to the first RDL through openings of the first dielectric layer.

2. The semiconductor package of claim 1, wherein the second dielectric layer, the third dielectric layer, dielectric layers in the first RDL, and dielectric layers in the second RDL are made by dielectric material of non-polymer type.

3. The semiconductor package of claim 1, wherein each of the bottom dies comprises two die-to-die connection circuits, an input/output circuit, and a physical interface circuit that are placed along edges of the bottom dies, and a die-to-die connection circuit of a first bottom die of the bottom dies is adjacent to a die-to-die connection circuit of a second bottom die of the bottom dies.

4. The semiconductor package of claim 3, wherein each of the top dies comprises two die-to-die connection circuits, an input/output circuit, and from a top view, die-to-die connection circuits of the top dies are aligned with die-to-die connection circuits of the bottom dies.

5. The semiconductor package of claim 1, wherein:

the top dies comprise a plurality of input/output dies, a plurality of physical interface dies, and a plurality of top computing dies;

the bottom dies comprise a plurality of bottom computing dies;

from a top view, die-to-die connection circuits of the top computing dies are aligned with die-to-die connection circuits of the bottom computing dies; and the input/output dies and the physical interface dies surround the top computing dies on the second bonding layer.

6. The semiconductor package of claim 1, wherein:

each of the top dies comprises a computation circuit, and a die-to-die connection circuit;

each of the bottom dies comprises a memory circuit, an input/output circuit, a physical interface circuit, and a plurality of die-to-die connection circuits; and from a top view, die-to-die connection circuits of the top dies are aligned with die-to-die connection circuits of the bottom dies.

7. The semiconductor package of claim 1, wherein a first bottom die of the bottom dies is coupled to a second bottom die of the bottom dies through the first RDL, and the first bottom die is coupled to a top die of the top dies through the second RDL.

8. The semiconductor package of claim 1, wherein from a top view, the first RDL comprises a first reticle region, a second reticle region adjacent to the first reticle region, and a plurality of conductive traces, wherein the first reticle region has a first interconnect layout pattern different from a second interconnect layout pattern of the second reticle region, and the plurality of conductive traces traverse a boundary between the first reticle region and the second reticle region perpendicularly.

9. The semiconductor package of claim 1, wherein the top dies receive power through the solder bumps, the first RDL, the conductive pillars, and the second RDL, and the bottom dies receive power through the solder bumps and the first RDL.

10. The semiconductor package of claim 1, further comprising:

an interposer; and a plurality of high bandwidth memories disposed on the interposer;

wherein the solder bumps are soldered to the interposer.

11. The semiconductor package of claim 9, wherein the bottom dies further receive power through the conductive pillars, the second RDL, and the TSVs.

12. A semiconductor package comprising:

a first dielectric layer;

a first redistribution layer (RDL) disposed on a first surface of the first dielectric layer, wherein the first RDL comprises:

a first reticle region; and a second reticle region adjacent to the first reticle region, wherein the first reticle region has a first interconnect layout pattern different from a second interconnect layout pattern of the second reticle region;

a first bonding layer disposed on the first RDL;

a plurality of bottom dies having bonding layers attached to the first bonding layer;

a second dielectric layer filling gaps between the bottom dies;

a plurality of conductive pillars disposed in the second dielectric layer without contacting the bottom dies;

a second RDL disposed on the second dielectric layer and coupled the conductive pillars and a plurality of through silicon vias (TSVs) formed in backsides of the bottom dies;

a second bonding layer disposed on the second RDL;

a plurality of top dies having bonding layers attached to the second bonding layer; and a third dielectric layer filling gaps between the top dies.

13. The semiconductor package of claim 12, wherein the first RDL further comprises a plurality of conductive traces, wherein the plurality of conductive traces traverse a boundary between the first reticle region and the second reticle region perpendicularly.

14. The semiconductor package of claim 12, wherein:

the first reticle region comprises a first overlapping region, the second reticle region comprises a second overlapping region, the first overlapping region and the second overlapping region overlap each other, the first overlapping region have a first overlapping interconnect layout pattern, the second overlapping region have a second overlapping interconnect layout pattern, and the first overlapping interconnect layout pattern and the second overlapping interconnect layout pattern are identical.

15. The semiconductor package of claim 14, wherein the first overlapping region and the second overlapping region do not include vias.

16. The semiconductor package of claim 15, wherein a size of the semiconductor package is 200 mm×200 mm.

17. The semiconductor package of claim 12, wherein from the top view, the first RDL further comprises a third reticle region and a fourth reticle region, wherein:

the third reticle region has a third interconnect layout pattern different from a fourth interconnect layout pattern of the fourth reticle region;

the first, the second, the third, and the fourth interconnect layouts are mutually different; and the first reticle region is adjacent to the third reticle region, and the second reticle region is adjacent to the fourth reticle region.

18. A semiconductor package comprising:

a first dielectric layer;

a first redistribution layer (RDL) disposed on a first surface of the first dielectric layer;

a first bonding layer disposed on the first RDL;

a plurality of bottom dies having bonding layers attached to the first bonding layer wherein the plurality of bottom dies comprises a plurality of bottom dies of a first type and a plurality of bottom dies of a second type that are arranged in a staggered manner;

a second dielectric layer filling gaps between the bottom dies;

a plurality of conductive pillars disposed in the second dielectric layer without contacting the bottom dies;

a second RDL disposed on the second dielectric layer and coupled the conductive pillars and a plurality of through silicon vias (TSVs) formed in backsides of the bottom dies;

a second bonding layer disposed on the second RDL;

a plurality of top dies having bonding layers attached to the second bonding layer; and a third dielectric layer filling gaps between the top dies.

19. The semiconductor package of claim 18, wherein:

the plurality of bottom dies are disposed in rows, the plurality of bottom dies in a first row are arranged alternately as the bottom dies of the first type and the bottom dies of the second type, and the plurality of bottom dies in a second row adjacent to the first row are arranged in a reversed alternating order relative to the first row.

20. The semiconductor package of claim 19, wherein the plurality of bottom dies in the second row are rotated by 180 degrees relative to the plurality of bottom dies in the first row, such that a die-to-die connection circuit of the each of the plurality of bottom dies of the first type in the first row is adjacent to a corresponding die-to-die connection circuit of an adjacent bottom die of the second type in the second row.

* * * * *